(12) United States Patent
Kim et al.

(10) Patent No.: US 12,101,882 B2
(45) Date of Patent: Sep. 24, 2024

(54) FLEXIBLE CIRCUIT BOARD AND WIRELESS TERMINAL COMPRISING SAME

(71) Applicant: GigaLane Co., Ltd., Hwaseong-si (KR)

(72) Inventors: Sang Pil Kim, Hwaseong-si (KR); Ik Soo Kim, Hwaseong-si (KR); Byung Yeol Kim, Hwaseong-si (KR); Hee Seok Jung, Hwaseong-si (KR)

(73) Assignee: GigaLane Co., Ltd., Hwaseong-si (KR)

( * ) Notice: Subject to any disclaimer, the term of this patent is extended or adjusted under 35 U.S.C. 154(b) by 436 days.

(21) Appl. No.: 17/428,332

(22) PCT Filed: Mar. 4, 2020

(86) PCT No.: PCT/KR2020/003079
§ 371 (c)(1),
(2) Date: Aug. 4, 2021

(87) PCT Pub. No.: WO2020/180112
PCT Pub. Date: Sep. 10, 2020

(65) Prior Publication Data
US 2022/0110212 A1  Apr. 7, 2022

(30) Foreign Application Priority Data
Mar. 4, 2019 (KR) .................. 10-2019-0024643

(51) Int. Cl.
*H05K 1/14* (2006.01)
*H05K 1/02* (2006.01)
(Continued)

(52) U.S. Cl.
CPC .......... *H05K 1/147* (2013.01); *H05K 1/028* (2013.01); *H05K 1/0393* (2013.01); *H05K 1/118* (2013.01)

(58) Field of Classification Search
CPC ........................................ H05K 1/147
(Continued)

(56) References Cited

U.S. PATENT DOCUMENTS

2010/0016039 A1* 1/2010 Tokuyama ............ H05K 1/118
29/830
2011/0121922 A1  5/2011 Blair
(Continued)

FOREIGN PATENT DOCUMENTS

CN   101496455 A   7/2009
CN   108476587 A   8/2018
(Continued)

OTHER PUBLICATIONS

International Search Report from International Application No. PCT/KR2020/003079, mailed Jun. 11, 2020.

*Primary Examiner* — Stanley Tso
(74) *Attorney, Agent, or Firm* — Shih IP Law Group, PLLC.

(57) ABSTRACT

A flexible circuit board according to an embodiment includes a first signal line extending on a first plane, a first dielectric extending in an extension direction of the first signal line while being in contact with the first signal line, a second signal line extending on a second plane parallel with the first plane, and a second dielectric extending in an extension direction of the second signal line while being in contact with the second signal line. The first signal line includes a first part overlapped with the second signal line and a second part not overlapped with the second signal line when viewed in a normal direction of the first plane, and the second signal line includes a first part overlapped with the first signal line and a second part not overlapped with the first signal line when viewed in the normal direction.

12 Claims, 28 Drawing Sheets

(51) Int. Cl.
*H05K 1/03* (2006.01)
*H05K 1/11* (2006.01)

(58) Field of Classification Search
USPC .......................................................... 174/254
See application file for complete search history.

(56) References Cited

U.S. PATENT DOCUMENTS

| | | | |
|---|---|---|---|
| 2011/0147053 A1* | 6/2011 | Kawaguchi .......... | H05K 1/0218 174/250 |
| 2014/0097021 A1 | 4/2014 | Su | |
| 2018/0206335 A1 | 7/2018 | Kim | |

FOREIGN PATENT DOCUMENTS

| | | |
|---|---|---|
| JP | 2007258593 A | 10/2007 |
| JP | 2010040888 A | 2/2010 |
| JP | 2012209479 A | 10/2012 |
| KR | 1020100127253 A | 12/2010 |
| KR | 10-2013-0140977 A | 12/2013 |

* cited by examiner

FLEXIBLE CIRCUIT BOARD AND WIRELESS TERMINAL COMPRISING SAME

CROSS-REFERENCE TO RELATED APPLICATIONS

This Application is a U.S. national phase application under 35 U.S.C. § 371 of PCT Application No. PCT/KR2020/003079 filed on Mar. 4, 2020, which claims the benefit of Korean Patent Application No. 10-2019-0024643 filed on Mar. 4, 2019, the entire disclosures of which are incorporated herein by reference.

TECHNICAL FIELD

The present invention relates to a flexible circuit board and a wireless terminal including the same.

BACKGROUND

As illustrated in FIG. 1, a flexible circuit board 1 is disposed so that a partial period is in surface contact with a housing 2. When disposed as such, the flexible circuit board 1 is easily disposed in a narrow space in a wireless terminal (for example, a smartphone, a tablet, a notebook, etc.). Here, the flexible circuit board 1 may include a plurality of signal lines used for transmitting a high frequency signal between an antenna and an antenna device.

At this time, the size of a space in which the flexible circuit board 1 is occupied in the wireless terminal is also related to the arrangement relation between the plurality of signal lines. That is, according to the arrangement relation between the plurality of signal lines described above, the space in which the flexible circuit board 1 is occupied in the wireless terminal may be decreased or increased, and accordingly, the size of the wireless terminal may also be decreased or increased. Further, according to the arrangement relation of the plurality of signal lines described above, a radius of curvature of the flexible circuit board 1 may increase or decrease, so that the flexible circuit board 1 may be not easily folded or easily folded.

SUMMARY

Technical Problem

An object of the present invention is to provide an arrangement relation of a plurality of signal lines and to provide a flexible circuit board including a plurality of signal lines disposed in the arrangement relation described above and a wireless terminal including the flexible circuit board.

However, the object of the present invention is not limited thereto.

Technical Solution

A flexible circuit board according to an embodiment includes a first signal line extending on a first plane, a first dielectric extending in an extension direction of the first signal line while being in contact with the first signal line, a second signal line extending on a second plane parallel with the first plane, and a second dielectric extending in an extension direction of the second signal line while being in contact with the second signal line. The first signal line includes a first part overlapped with the second signal line and a second part not overlapped with the second signal line when viewed in a normal direction of the first plane, and the second signal line includes a first part overlapped with the first signal line and a second part not overlapped with the first signal line when viewed in the normal direction.

The second part of the first signal line may include a first-A bending portion which is connected with the first part of the first signal line and formed to be bent on the first plane, a first-A extension portion extending on the first plane from a direction in which the first-A bending portion is bent and directed, a first-B bending portion which is formed to be bent on the first plane from the extended first-A extension portion, and a first-B extension portion extending on the first plane from a direction in which the first-B bending portion is bent and directed, and the second part of the second signal line may include a second-A bending portion which is connected with the first part of the second signal line and formed to be bent on the second plane, a second-A extension portion extending on the second plane from a direction in which the second-A bending portion is bent and directed, a second-B bending portion which is formed to be bent on the second plane from the extended second-A extension portion, and a second-B extension portion extending on the second plane from a direction in which the second-B bending portion is bent and directed.

The flexible circuit board may further include a third signal line extending on a third plane parallel with the second plane; and third dielectric extending in an extension direction of the third signal line while being in contact with the third signal line, wherein the third signal line may include a first part which overlaps with both the first signal line and the second signal line and a second part which does not overlap with any one of the first signal line and the second signal line, when viewed in the normal direction, and the second part of the third signal line may include a third-A bending portion which is connected with the first part of the third signal line and formed to be bent on the third plane, a third-A extension portion extending on the third plane from a direction in which the third-A bending portion is bent and directed, a third-B bending portion which is formed to be bent on the third plane from the extended third-A extension portion, and a third-B extension portion extending on the third plane from a direction in which the third-B bending portion is bent and directed.

The length of the first-A extension portion may be larger than the length of the second-A extension portion, a distance between a vertical plane including the first part of the first signal line and the first-B extension portion may be farther than a distance between the vertical plane and the second-B extension portion, the length of the second-A extension portion may be larger than the length of the third-A extension portion, and a distance between a vertical plane including the first part of the second signal line and the second-B extension portion may be farther than a distance between the vertical plane and the third-B extension portion.

The length of the first-A extension portion may be smaller than the length of the second-A extension portion, a distance between a vertical plane including the first part of the first signal line and the first-B extension portion may be closer than the distance between the vertical plane and the second-B extension portion, the length of the second-A extension portion may be smaller than the length of the third-A extension portion, and a distance between a vertical plane including the first part of the second signal line and the second-B extension portion may be closer than a distance between the vertical plane and the third-B extension portion.

A portion in contact with the second-A extension portion of the second dielectric may be at least partially overlapped with a portion in contact with the first-A extension portion of the first dielectric, but may not be overlapped with the first signal line, when viewed in the normal direction, and a portion in contact with the third-A extension portion of the third dielectric may be at least partially overlapped with a portion in contact with the second-A extension portion of the second dielectric, but may not be overlapped with the second signal line, when viewed in the normal direction.

A portion in contact with the second-B extension portion of the second dielectric may be at least partially overlapped with a portion in contact with the first-B extension portion of the first dielectric, but may not be overlapped with the first signal line, when viewed in the normal direction, and a portion in contact with the third-B extension portion of the third dielectric may be at least partially overlapped with a portion in contact with the second-B extension portion of the second dielectric, but may not be overlapped with the second signal line, when viewed in the normal direction.

A portion in contact with the second-A extension portion of the second dielectric may be at least partially overlapped with a portion in contact with the first-A extension portion of the first dielectric, but may not be overlapped with the first signal line, when viewed in the normal direction, a portion in contact with the second-B extension portion of the second dielectric may be at least partially overlapped with a portion in contact with the first-B extension portion of the first dielectric, but may not be overlapped with the first signal line, when viewed in the normal direction, a portion in contact with the third-A extension portion of the third dielectric may be at least partially overlapped with a portion in contact with the second-A extension portion of the second dielectric, but may not be overlapped with the second signal line, when viewed in the normal direction, and a portion in contact with the third-B extension portion of the third dielectric may be at least partially overlapped with a portion in contact with the second-B extension portion of the second dielectric, but may not be overlapped with the second signal line, when viewed in the normal direction.

The flexible circuit board may further include a first integrated dielectric which is placed on a fourth plane between the first dielectric and the second dielectric while being parallel with the first plane and overlapped with the first dielectric and the second dielectric when viewed in the normal direction.

The first integrated dielectric may further include a portion corresponding to a portion not overlapped with any one of the first dielectric and the second dielectric between the portion overlapped with the first dielectric and the portion overlapped with the second dielectric, when viewed in the normal direction.

The first integrated dielectric may not include a portion corresponding to a portion not overlapped with any one of the first dielectric and the second dielectric between the portion overlapped with the first dielectric and the portion overlapped with the second dielectric, when viewed in the normal direction.

The flexible circuit board may further include a third signal line extending on a third plane parallel with the second plane while including a first part overlapped with the first signal line and the second signal line when viewed in the normal direction and a second part not overlapped with any one of the first signal line and the second signal line when viewed in the normal direction; a third dielectric extending in an extension direction of the third signal line while being in contact with the third signal line; and a second integrated dielectric which is placed on a fifth plane between the second dielectric and the third dielectric while being parallel with the first plane and overlapped with the second dielectric and the third dielectric when viewed in the normal direction.

The second integrated dielectric may further include a portion corresponding to a portion not overlapped with any one of the second dielectric and the third dielectric between the portion overlapped with the second dielectric and the portion overlapped with the third dielectric, when viewed in the normal direction.

The second integrated dielectric may not include a portion corresponding to a portion not overlapped with any one of the second dielectric and the third dielectric between the portion overlapped with the second dielectric and the portion overlapped with the third dielectric, when viewed in the normal direction.

The flexible circuit board may further include a first bonding sheet or a first prepreg which is disposed between the first integrated dielectric and the first dielectric or between the first integrated dielectric and the second dielectric to be bonded between the first integrated dielectric and the first dielectric or bonded between the first integrated dielectric and the second dielectric; and a second bonding sheet or a second prepreg which is disposed between the second integrated dielectric and the second dielectric or between the second integrated dielectric and the third dielectric to be bonded between the second integrated dielectric and the second dielectric or bonded between the second integrated dielectric and the third dielectric.

The flexible circuit board may further include a first shield portion which is in contact with a portion overlapped with the second dielectric of the first integrated dielectric when viewed in the normal direction; and a second shield portion which is in contact with a portion overlapped with the third dielectric of the second integrated dielectric when viewed in the normal direction.

The flexible circuit board may further include a first integrated ground which is in contact with a portion overlapped with the first dielectric of the first integrated dielectric when viewed in the normal direction and has a shape corresponding to the shape of the first dielectric when viewed in the normal direction; and a second integrated ground which is in contact with the portion overlapped with the second dielectric of the second integrated dielectric when viewed in the normal direction and has a shape corresponding to the shape of the second dielectric when viewed in the normal direction.

Each of the first shield portion and the second shield portion may include a conductive paste or an electromagnetic interference (EMI) shield film.

The flexible circuit board may further include a first integrated ground which is in contact with the first integrated dielectric and has a shape corresponding to the shape of the first integrated dielectric when viewed in the normal direction; and a second integrated ground which is in contact with the second integrated dielectric and has a shape corresponding to the shape of the second integrated dielectric when viewed in the normal direction.

The flexible circuit board may further include a first shield portion which is in contact with a portion overlapped with the second dielectric of the first integrated ground when viewed in the normal direction; and a second shield portion which is in contact with a portion overlapped with the third dielectric of the second integrated ground when viewed in the normal direction.

Each of the first shield portion and the second shield portion may include a conductive paste or an electromagnetic interference (EMI) shield film.

The second part of the first signal line may include a first-A bending portion which is connected with the first part of the first signal line and formed to be bent on the first plane, and a first-A extension portion extending on the first plane from a direction in which the first-A bending portion is bent and directed, and the second part of the second signal line may include a second-A bending portion which is connected with the first part of the second signal line and formed to be bent on the second plane, and a second-A extension portion extending on the second plane from a direction in which the second-A bending portion is bent and directed.

A portion in contact with the second-A extension portion of the second dielectric may be at least partially overlapped with a portion in contact with the first-A extension portion of the first dielectric, but may not be overlapped with the first signal line, when viewed in the normal direction.

The flexible circuit board may further include a third signal line extending on a third plane parallel with the second plane; and third dielectric extending in an extension direction of the third signal line while being in contact with the third signal line, wherein the third signal line may include a first part which overlaps with both the first signal line and the second signal line and a second part which does not overlap with any one of the first signal line and the second signal line, when viewed in the normal direction, and the second part of the third signal line may include a third-A bending portion which is connected with the first part of the third signal line and formed to be bent on the third plane, and a third-A extension portion extending on the third plane from a direction in which the third-A bending portion is bent and directed.

A portion in contact with the third-A extension portion of the third dielectric may be at least partially overlapped with a portion in contact with the second-A extension portion of the second dielectric, but may not be overlapped with the second signal line, when viewed in the normal direction.

The second part of the first signal line may include a first-A bending portion which is connected with the first part of the first signal line and formed to be bent on the first plane, a first-A extension portion extending on the first plane from a direction in which the first-A bending portion is bent and directed, a first-B bending portion which is formed to be bent on the first plane from the extended first-A extension portion, and a first-B extension portion extending on the first plane from a direction in which the first-B bending portion is bent and directed, and the second part of the second signal line may include a second-B extension portion which is connected with the first part of the second signal line to be extended on the second plane.

The flexible circuit board may further include a third signal line extending on a third plane parallel with the second plane; and third dielectric extending in an extension direction of the third signal line while being in contact with the third signal line, wherein the third signal line may include a first part which overlaps with both the first signal line and the second signal line and a second part which does not overlap with any one of the first signal line and the second signal line, when viewed in the normal direction, and the second part of the third signal line may include a third-A bending portion which is connected with the first part of the third signal line and formed to be bent on the third plane, a third-A extension portion extending on the third plane from a direction in which the third-A bending portion is bent and directed, a third-B bending portion which is formed to be bent on the third plane from the extended third-A extension portion, and a third-B extension portion extending on the third plane from a direction in which the third-B bending portion is bent and directed.

The second part of the first signal line and the second part of the third signal line may be symmetrical with each other based on the second part of the second signal line when viewed in the normal direction.

The length of the third-A extension portion may be larger than the length of the first-A extension portion, and a distance between a vertical plane including the first part of the third signal line and the third-B extension portion may be farther than a distance between the vertical plane and the first-B extension portion.

The flexible circuit board may include two first parts of the first signal line and two second parts of the first signal line, and two first parts of the second signal line and two second parts of the second signal line, wherein the two second parts of the first signal line may be symmetrically connected to each other, and each of the two first parts of the first signal line is connected to one end of the second part of the first signal line, and the two second parts of the second signal line are symmetrically connected to each other, and each of the two first parts of the second signal line may be connected to one end of the second part of the second signal line.

A wireless terminal according to an embodiment includes a first signal line extending on a first plane, a first dielectric extending in an extension direction of the first signal line while being in contact with the first signal line, a second signal line extending on a second plane parallel with the first plane, and a second dielectric extending in an extension direction of the second signal line while being in contact with the second signal line. The first signal line includes a first part overlapped with the second signal line and a second part not overlapped with the second signal line when viewed in a normal direction of the first plane, and the second signal line includes a first part overlapped with the first signal line and a second part not overlapped with the first signal line when viewed in the normal direction. Each of at least a part of the second part of the first signal line and at least a part of the second part of the second signal line is disposed to be in contact with a surface in the wireless terminal, which is provided to be vertical to the first plane.

A wireless terminal according to another embodiment includes a battery; a first signal line extending on a first plane; a first dielectric extending in an extension direction of the first signal line while being in contact with the first signal line; a second signal line extending on a second plane parallel with the first plane; and a second dielectric extending in an extension direction of the second signal line while being in contact with the second signal line. The first signal line may include a first part overlapped with the second signal line and a second part not overlapped with the second signal line when viewed in a normal direction of the first plane, the second signal line may include a first part overlapped with the first signal line and a second part not overlapped with the first signal line when viewed in the normal direction, and at least a part of the second part of the first signal line and the second part of the second signal line may be disposed above or below the battery.

Advantageous Effects

According to an embodiment of the present invention, when the flexible circuit board includes the plurality of signal lines and the plurality of dielectrics, first parts which are parts of these signal lines and dielectrics in contact with these first parts overlap with each other when viewed in a predetermined direction. Accordingly, it is possible to minimize a space where the signal lines and the dielectrics described above are occupied in the flexible circuit board when viewed in a predetermined direction.

Further, second parts which are the remaining parts of these signal lines and dielectrics in contact with these second parts do not overlap with each other when viewed in a predetermined direction, that is, these second parts and the dielectrics in contact with the second parts are disposed to be spaced apart from each other when viewed in a predetermined direction. Accordingly, the radius of curvature to these second parts and the dielectrics in contact with these second parts may be reduced, thereby easily folding a part of the flexible circuit board. That is, according to an embodiment, a part of the flexible circuit board may be easily folded so as to be in surface contact with the housing in the wireless terminal.

DETAILED DESCRIPTION

Figure 23:
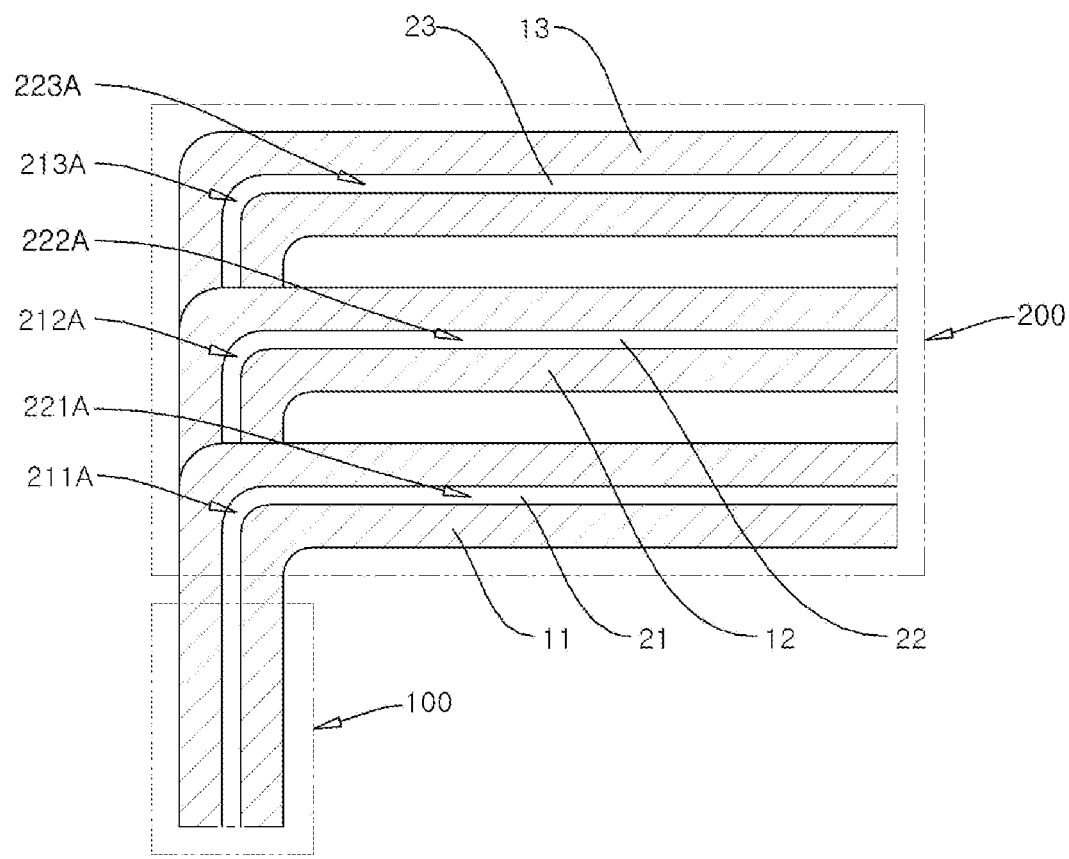
FIGS. 23 and 24 are diagrams according to Embodiment 2.
Figure 24:
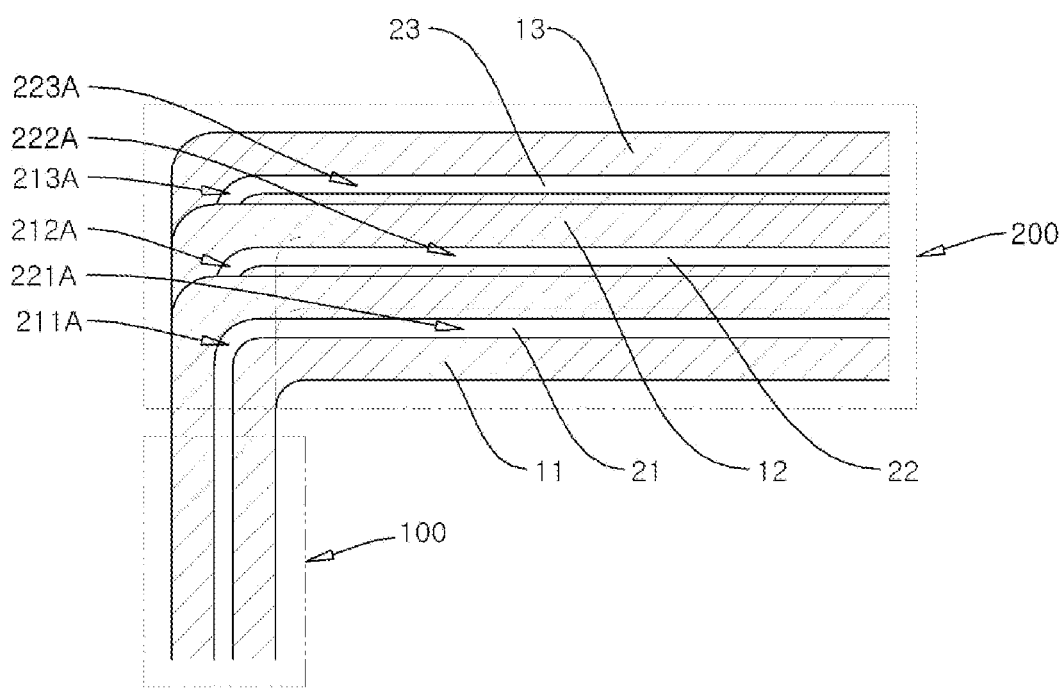
Figure 25:
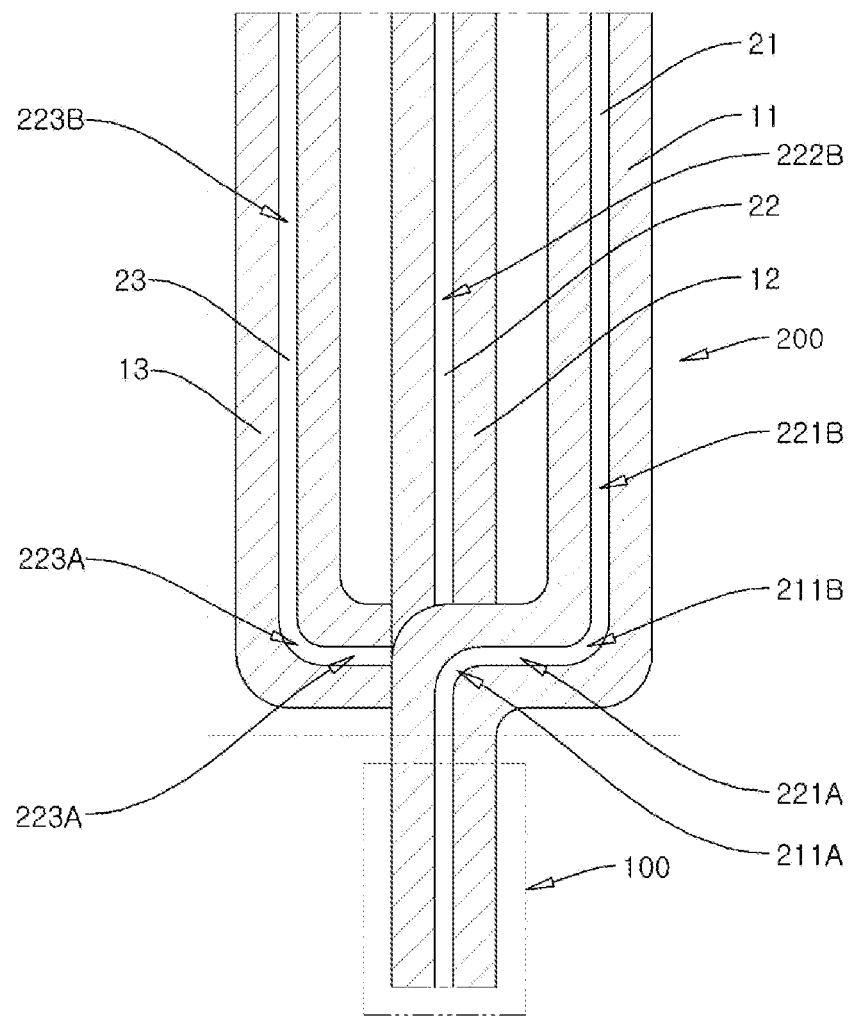
FIGS. 25 to 26 are diagrams according to Embodiment 3.
Figure 26:
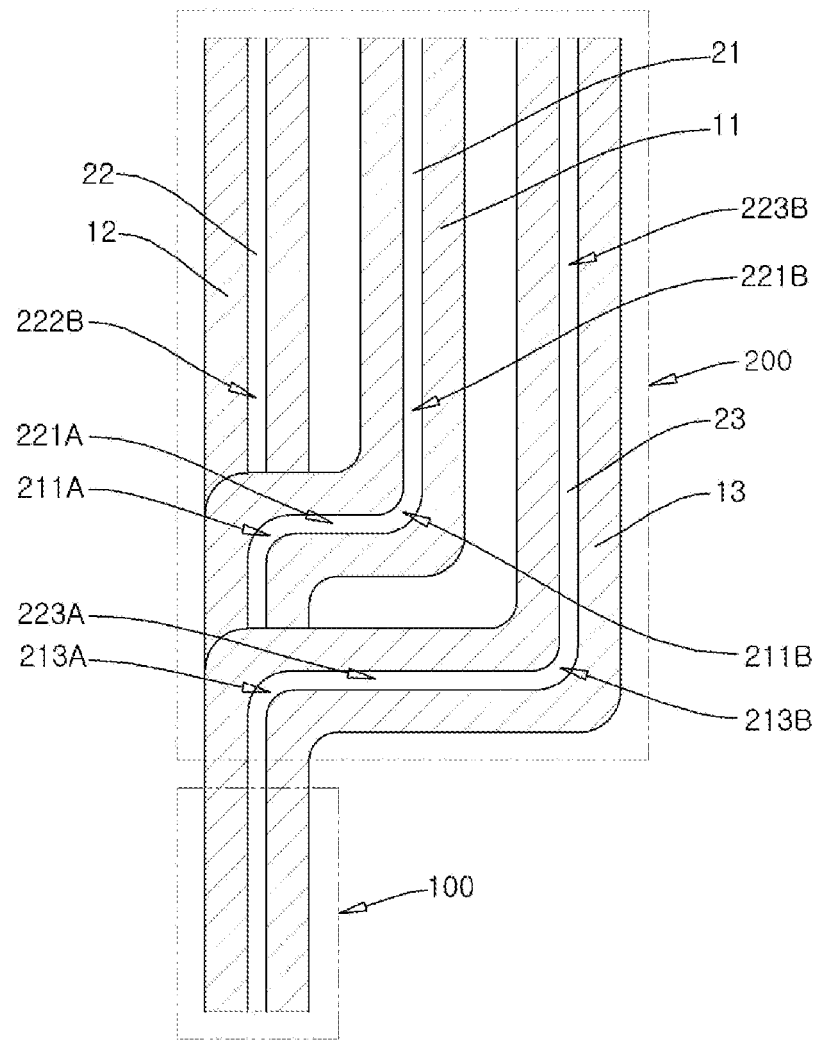

A flexible circuit board 1 according to an embodiment of the present invention includes Embodiments 1 to 3 when described based on the drawings. Among them, FIGS. 2 to 6 are diagrams according to Embodiment 1, FIGS. 23 and 24 are diagrams according to Embodiment 2, and FIGS. 25 and 26 are diagrams according to Embodiment 3.

Figure 32:
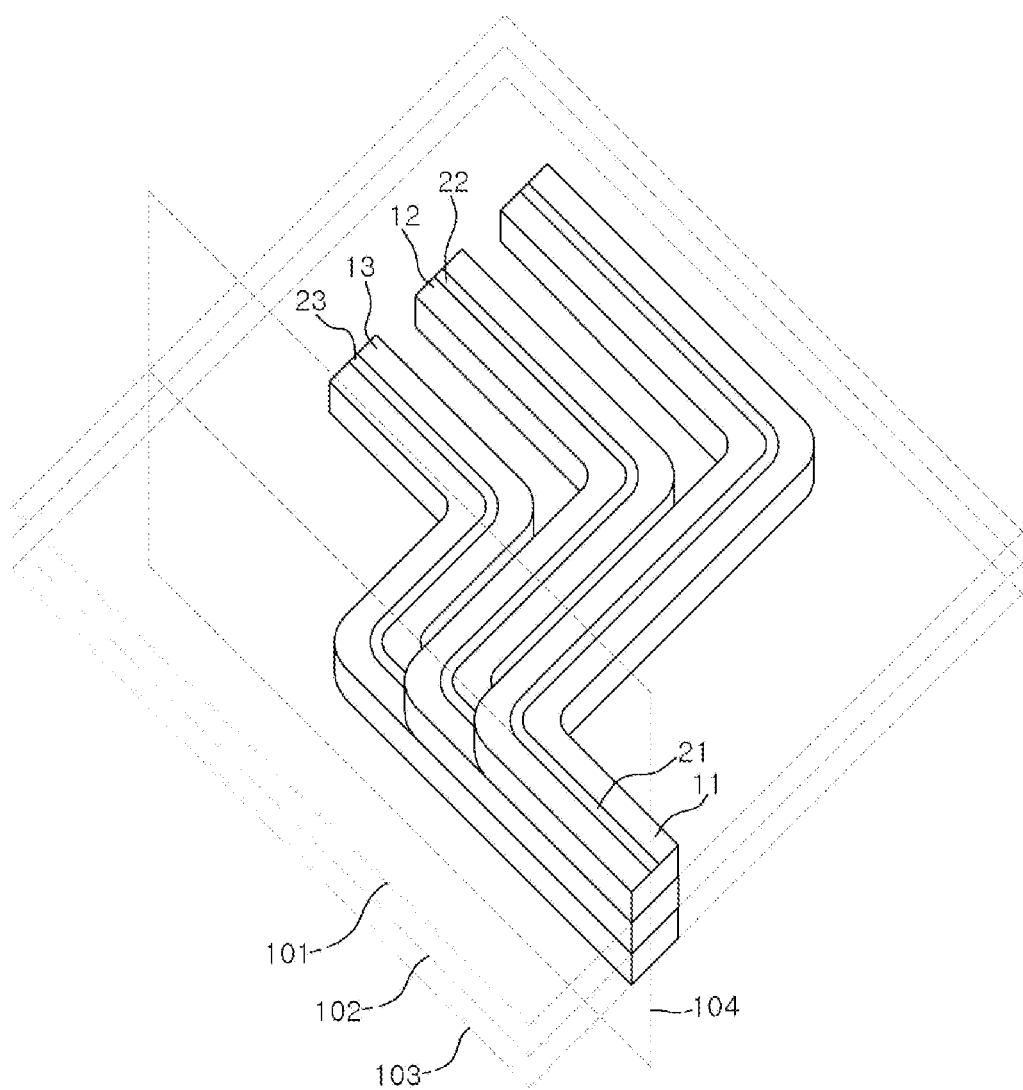
FIG. 32 is a perspective view of the flexible circuit board illustrated in FIGS. 2 to 6.

First, Embodiment 1 will be described with reference to FIG. 32 together.

The flexible circuit board 1 according to Embodiment 1 may include a first dielectric 11, a second dielectric 12, a third dielectric 13, a first signal line 21, a second signal line 22, and a third signal line 23 as illustrated in FIGS. 2 to 6 and 32.

First, the first signal line 21 extends on a first plane 101, the second signal line 22 extends on a second plane 102 parallel to the first plane 101, and the third signal line 23 extends on a third plane 103 parallel to both the first plane 101 and the second plane 102. Each of these signal lines 21 to 23 is a configuration used for the purpose of transmitting a high frequency signal between an antenna and an antenna element. For example, the flexible circuit board 1 is electrically connected to a sub board 4 to which the antenna is electrically connected and a main board 3 to which the antenna element is electrically connected to transmit a high frequency signal to the antenna and the antenna element.

The first dielectric 11 has the first signal line 21 in contact with an upper surface or lower surface thereof and a width extending based on the first signal line 21 and extends in an extension direction of the first signal line 21. The dielectric may be configured to include a general dielectric material and the following dielectric is also the same.

The second dielectric 12 is located below the first dielectric 11, has the second signal line 22 in contact with the upper or lower surface thereof and a width extending based on the second signal line 22, and extends in an extension direction of the second signal line 22.

The third dielectric 13 is located below the second dielectric 12, has the third signal line 23 in contact with the upper or lower surface thereof and a width extending based on the third signal line 23, and extends in an extension direction of the third signal line 23.

Here, the first signal line 21 includes a first part 100 which overlaps with both the second signal line 22 and the third signal line 23 and a second part 200 which does not overlap with any one of the second signal line 22 and the third signal line 23, when viewed in a normal direction of the first plane 101 (in the following detailed description and claims, the 'normal direction' is referred to as a normal direction of the first plane 101).

In addition, the second signal line 22 includes a first part 100 which overlaps with both the first signal line 21 and the third signal line 23 and a second part 200 which does not overlap with any one of the first signal line 21 and the third signal line 23, when viewed in a normal direction.

In addition, the third signal line 23 includes a first part 100 which overlaps with both the first signal line 21 and the second signal line 22 and a second part 200 which does not overlap with any one of the first signal line 21 and the second signal line 22, when viewed in a normal direction.

Here, according to an embodiment, when the flexible circuit board includes the plurality of signal lines and the plurality of dielectrics, first parts 100 which are parts of these signal lines and dielectrics in contact with the first parts 100 overlap with each other when viewed in a predetermined direction. Accordingly, it is possible to minimize a space where the signal lines and the dielectrics described above are occupied in the flexible circuit board when viewed in a predetermined direction.

Further, second parts 200 which are the remaining parts of these signal lines and dielectrics in contact with the second parts 200 do not overlap with each other when viewed in a predetermined direction, that is, these second parts 200 and the dielectrics in contact with these second parts are disposed to be spaced apart from each other when viewed in a predetermined direction. Accordingly, the thicknesses of these second parts 200 and the dielectrics in contact with these second parts are spaced and distributed to be smaller than the thickness for the first parts 100 and the dielectrics in contact with the first parts 100 so that the radius of curvature may be reduced, thereby easily folding the part of the flexible circuit board. That is, according to an embodiment, a part of the flexible circuit board may be easily folded so as to be in surface contact with the housing in the wireless terminal. Meanwhile, Embodiment 1 illustrated in FIGS. 2 to 6 and 32 is just illustrative, and the scope of the present invention is not limited thereto. For example, according to an embodiment, the flexible circuit board 1 may not include the first dielectric 11, the first signal line 21, and configurations related thereto, may not include the second dielectric 12, the second signal line 22, and configurations related thereto, or may not include the third dielectric 13, the third signal line 23, and configurations related thereto.

In addition, the flexible circuit board 1 may also further include dielectrics, signal lines, and configurations related thereto, without greatly departing from any one relation of the relation between the first dielectric 11 and the second dielectric 12, the relation between the second dielectric 12 and the third dielectric 13, the relation between the first signal line 21 and the second signal line 22, and the relation between the second signal line 22 and the third signal line 23 as described below.

Those described above through FIGS. 2 to 6 and 32 may be applied to Embodiment 1 of course, and may also be applied to Embodiments 2 and 3 to be described below.

According to the embodiment of the present invention, the first signal line 21 of the flexible circuit board 1 is the second part 200, and may include a first-A bending portion 211A which is connected with the first part 100 of the first signal line 21 and formed to be bent on the first plane 101, a first-A extension portion 221A extending on the first plane 101 from a direction in which the first-A bending portion 211A is bent and directed, a first-B bending portion 211B which is formed to be bent on the first plane 101 from the extended first-A extension portion 221A, and a first-B extension portion 221B extending on the first plane 101 from a direction in which the first-B bending portion 211B is bent and directed.

Further, the second signal line 22 of the flexible circuit board 1 is the second part 200, and may include a second-A bending portion 212A which is connected with the first part 100 of the second signal line 22 and formed to be bent on the second plane 102, a second-A extension portion 222A extending on the second plane 102 from a direction in which the second-A bending portion 212A is bent and directed, a second-B bending portion 212B which is formed to be bent on the second plane 102 from the extended second-A extension portion 222A, and a second-B extension portion 222B extending on the second plane 102 from a direction in which the second-B bending portion 212B is bent and directed.

Further, the third signal line 23 of the flexible circuit board 1 is the second part 200, and may include a third-A bending portion 213A which is connected with the first part 100 of the third signal line 23 and formed to be bent on the third plane 103, a third-A extension portion 223A extending on the third plane 103 from a direction in which the third-A bending portion 213A is bent and directed, a third-B bending portion 213B which is formed to be bent on the third plane 103 from the extended third-A extension portion 223A, and a third-B extension portion 223B extending on the third plane 103 from a direction in which the third-B bending portion 213B is bent and directed.

Here, the first-A extension portion 221A, the second-A extension portion 222A and the third-A extension portion 223A may be disposed to be folded or in contact with the housing 2, respectively. This may be applied in the same manner even in the first-B extension portion 221B, the second-B extension portion 222B and the third-B extension portion 223B.

Meanwhile, the relative lengths among the first-A extension portion 221A, the second-A extension portion 222A and the third-A extension portion 223A included in the flexible circuit board 1 may be different from each other, and the relative lengths among the first-B extension portion 221B, the second-B extension portion 222B and the third-B extension portion 223B may also be different from each other.

Figure 1:
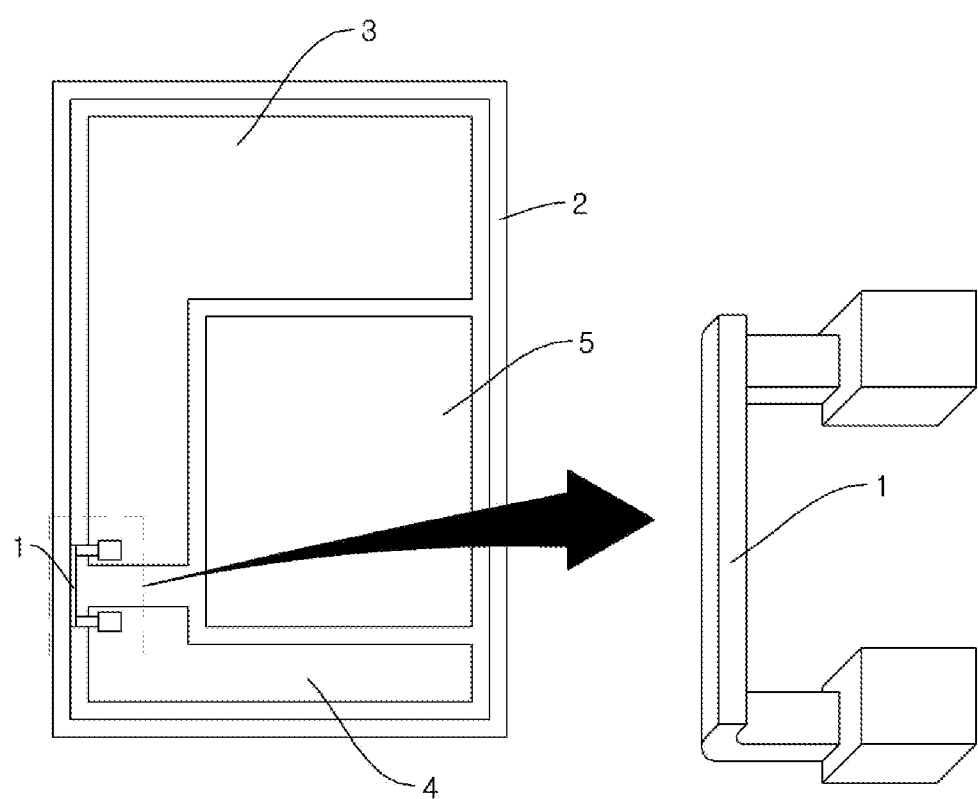
FIG. 1 is a diagram for describing a shape in which a flexible circuit board is disposed in a conventional wireless terminal.
Figure 2:
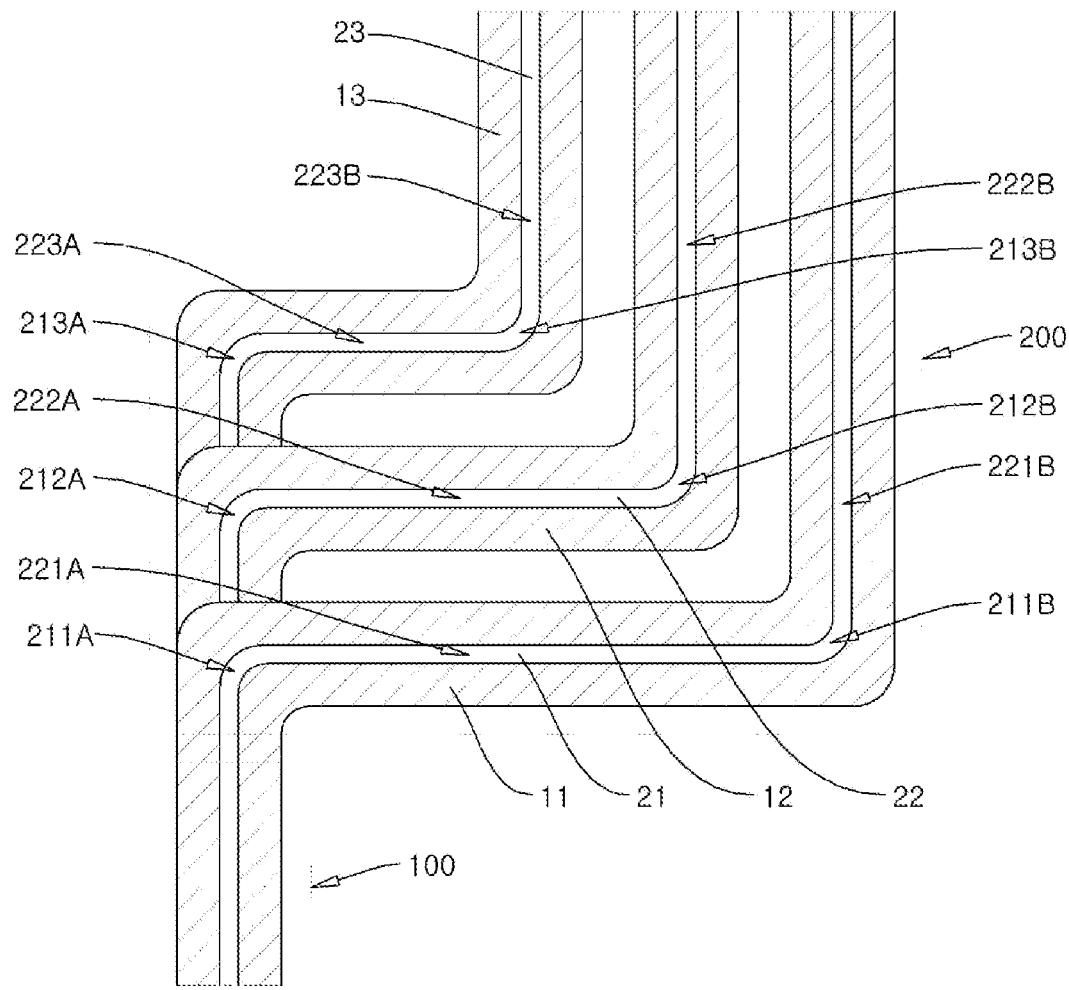
FIGS. 2 to 6 are diagrams according to Embodiment 1.

As an example of the different relative length, as illustrated in FIG. 2, the length of the first-A extension portion 221A is larger than the length of the second-A extension portion 222A. As a result, a distance between a vertical plane 104 (the plane 104 vertical to the first plane 101 as illustrated in FIG. 32) including the first part 100 of the first signal line 21 and the first-B extension portion 221B may be farther than a distance between the vertical plane 104 and the second-B extension portion 222B.

Further, the length of the second-A extension portion 222A is larger than the length of the third-A extension portion 223A and a distance between a vertical plane 104 including the first part 100 of the second signal line 22 and the second-B extension portion 222B may be farther than a distance between the vertical plane 104 and the third-B extension portion 223B.

Figure 3:
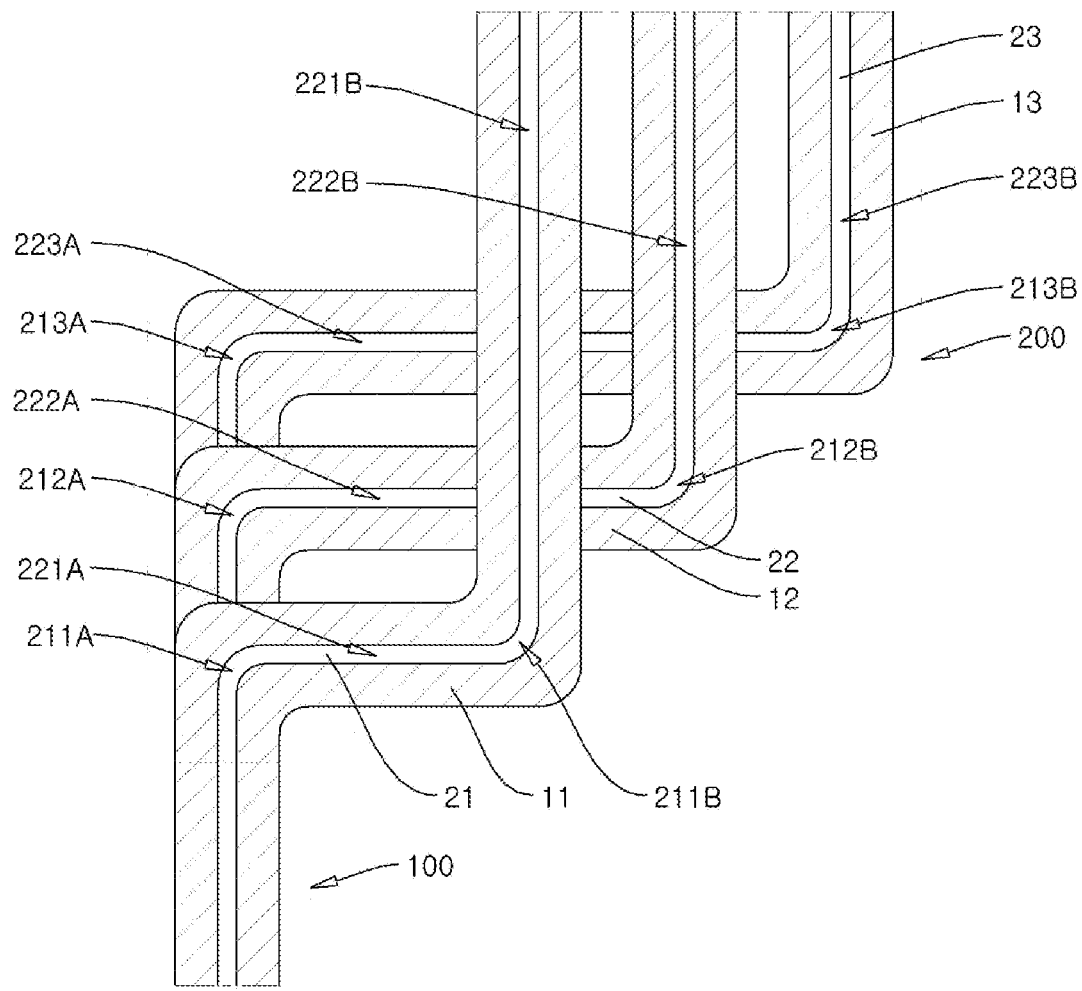

As another example of the different relative length, as illustrated in FIG. 3, the length of the first-A extension portion 221A is smaller than the length of the second-A extension portion 222A and a distance between a vertical plane 104 including the first part 100 of the first signal line 21 and the first-B extension portion 221B may be closer than the distance between the vertical plane 104 and the second-B extension portion 222B.

Further, the length of the second-A extension portion 222A is smaller than the length of the third-A extension portion 223A and a distance between a vertical plane 104 including the first part 100 of the second signal line 22 and the second-B extension portion 222B may be closer than a distance between the vertical plane 104 and the third-B extension portion 223B.

The flexible circuit board 1 according to the embodiment of the present invention may be disposed so that the first dielectric 11, the second dielectric 12, and the third dielectric 13 are partially overlapped with each other when viewed in a normal direction, so that a space occupied by the dielectrics 11 to 13 when viewed in the normal direction may be smaller than that of the embodiment if not.

Figure 4:
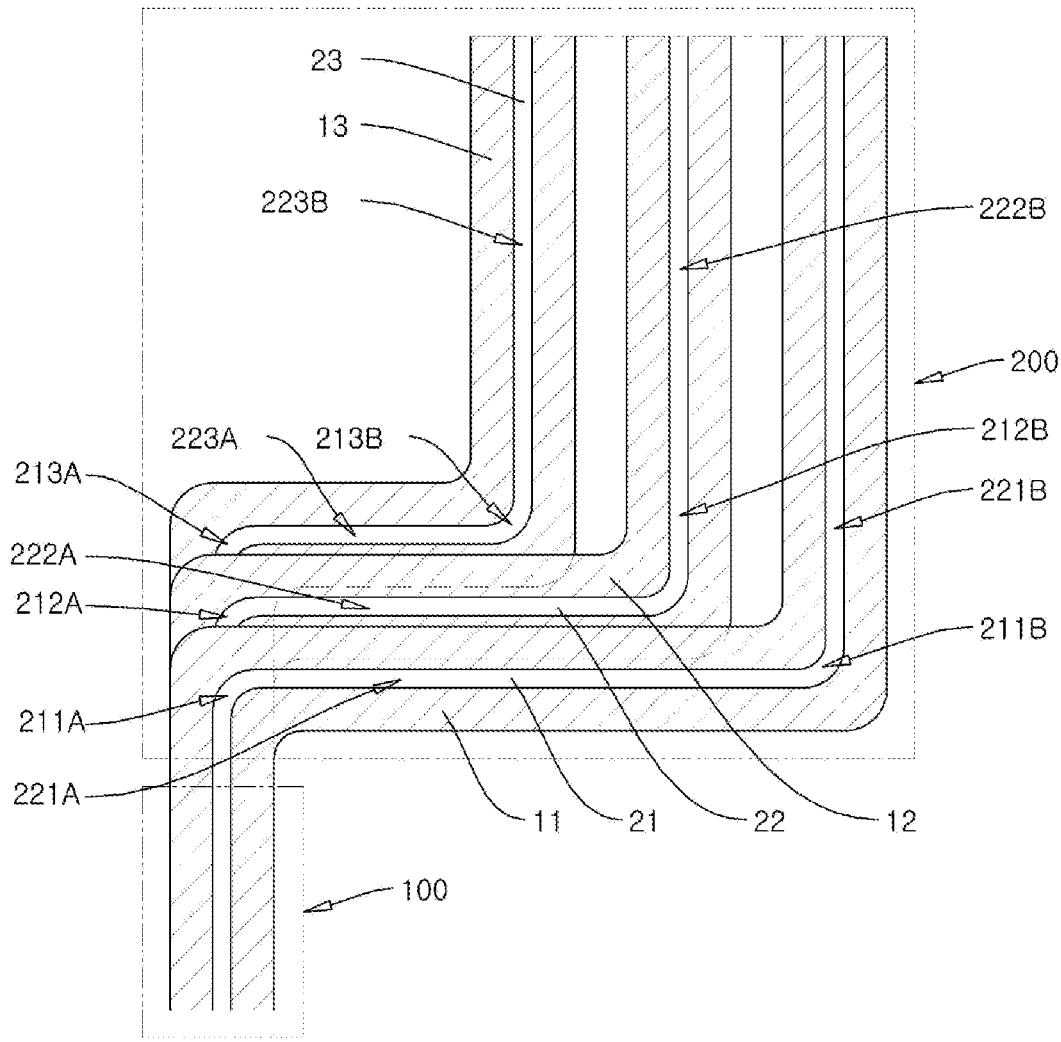

As an example in which the dielectrics 11 to 13 are partially overlapped with each other, as illustrated in FIG. 4, a portion in contact with the second-A extension portion 222A of the second dielectric 12 is at least partially overlapped with a portion in contact with the first-A extension portion 221A of the first dielectric 11, but may not overlap with the first signal line 21, when viewed in the normal direction.

Further, a portion in contact with the third-A extension portion 223A of the third dielectric 13 is at least partially overlapped with a portion in contact with the second-A extension portion 222A of the second dielectric 12, but may not overlap with the second signal line 22, when viewed in the normal direction.

That is, the length between the first signal line 21 of the first-A extension portion 221A and the second signal line 22 of the second-A extension portion 222A may be smaller than the length between the first signal line 21 of the first-B extension portion 221B and the second dielectric 12 of the second-B extension portion 222B. Further, the length between the second signal line 22 of the second-A extension portion 222A and the third signal line 23 of the third-A extension portion 223A may be smaller than the length between the second signal line 22 of the second-B extension portion 222B and the third dielectric 13 of the third-B extension portion 223B.

As such, when the second dielectric 12 of the second-A extension portion 222A is at least partially overlapped with the first dielectric 11 of the first-A extension portion 221A in the normal direction and the third dielectric 13 of the third-A extension portion 223A is at least partially overlapped with the second dielectric 12 of the second-A extension portion 222A in the normal direction, the widths of the overlapped portions are decreased.

As such, the space occupied by the dielectrics 11 to 13 when viewed in the normal direction is smaller than the embodiment if not, so that it is advantageous in the arrangement in the case where the space where the flexible circuit board 1 is disposed is small (for example, a case where the elements are disposed around the disposed space and the space where the flexible circuit board 1 is disposed is small).

Figure 5:
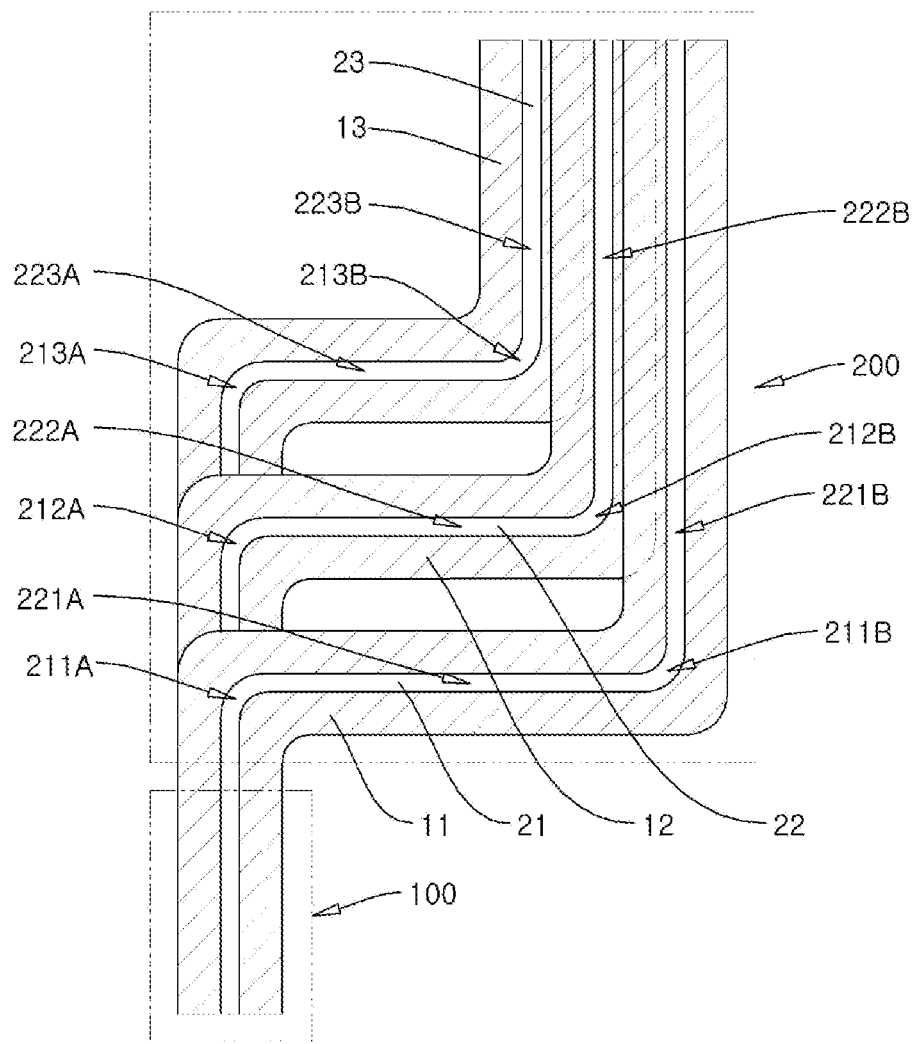

As another example in which the dielectrics 11 to 13 are partially overlapped with each other, as illustrated in FIG. 5, a portion in contact with the second-B extension portion 222B of the second dielectric 12 is at least partially overlapped with a portion in contact with the first-B extension portion 221B of the first dielectric 11, but may not overlap with the first signal line 21, when viewed in the normal direction. Further, a portion in contact with the third-B extension portion 223B of the third dielectric 13 is at least partially overlapped with a portion in contact with the second-B extension portion 222B of the second dielectric 12, but may not overlap with the second signal line 22, when viewed in the normal direction.

That is, the length between the first signal line 21 of the first-A extension portion 221A and the second signal line 22 of the second-A extension portion 222A may be larger than the length between the first signal line 21 of the first-B extension portion 221B and the second dielectric 12 of the second-B extension portion 222B. Further, the length between the second signal line 22 of the second-A extension portion 222A and the third signal line 23 of the third-A extension portion 223A may be larger than the length between the second signal line 22 of the second-B extension portion 222B and the third dielectric 13 of the third-B extension portion 223B.

As such, when the second dielectric 12 of the second-B extension portion 222B is at least partially overlapped with the first dielectric 11 of the first-B extension portion 221B in the normal direction and the third dielectric 13 of the third-B extension portion 223B is at least partially overlapped with the second dielectric 12 of the second-B extension portion 222B in the normal direction, the widths of the overlapped portions are decreased.

As such, the space occupied by the dielectrics 11 to 13 when viewed in the normal direction is smaller than the embodiment if not, so that it is advantageous in the arrangement in the case where the space where the flexible circuit board 1 is disposed is small (for example, a case where the elements are disposed around the disposed space and the space where the flexible circuit board 1 is disposed is small).

Figure 6:
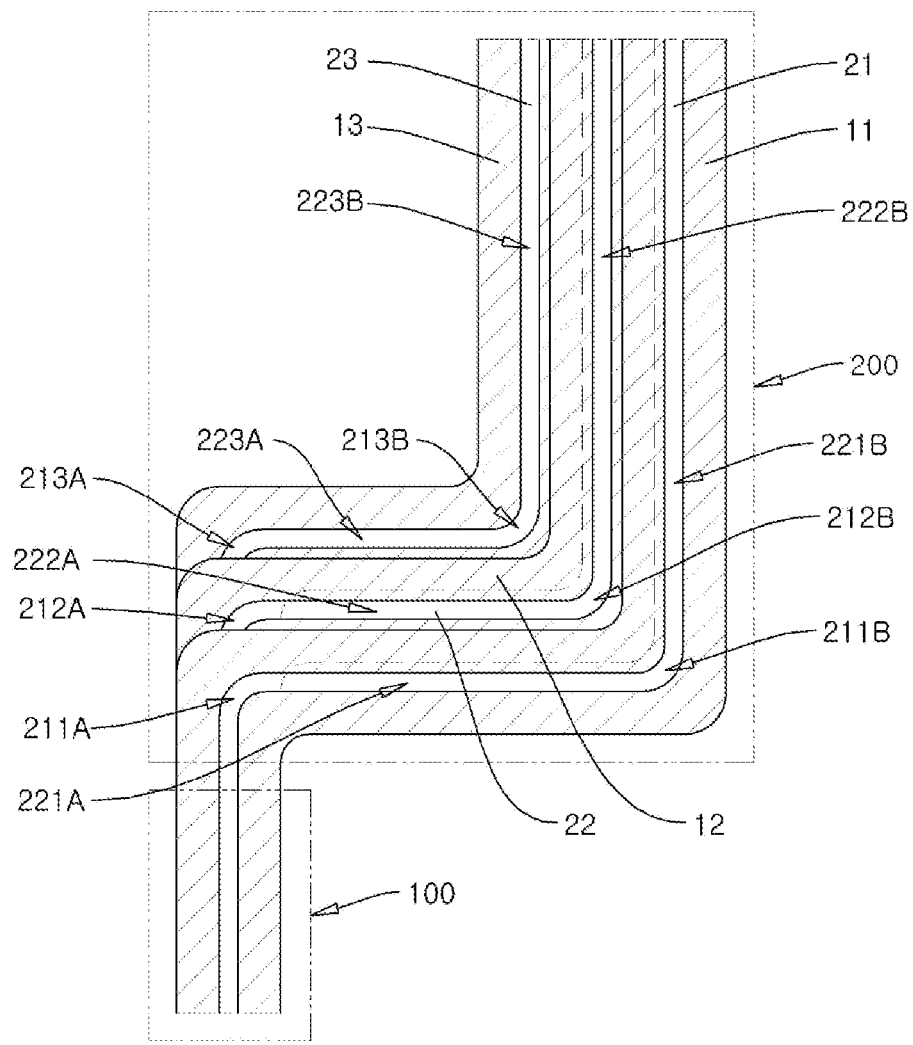

As yet another example in which the dielectrics 11 to 13 are partially overlapped with each other, as illustrated in FIG. 6, a portion in contact with the second-A extension portion 222A of the second dielectric 12 is at least partially overlapped with a portion in contact with the first-A extension portion 221A of the first dielectric 11, but may not overlap with the first signal line 21, when viewed in the normal direction. In addition, a portion in contact with the second-B extension portion 222B of the second dielectric 12 is partially overlapped with the portion in contact with the first-B extension portion 221B of the first dielectric 11, but may not overlap with the first signal line 21, when viewed in the normal direction.

Further, a portion in contact with the third-A extension portion 223A of the third dielectric 13 is at least partially overlapped with a portion in contact with the second-A extension portion 222A of the second dielectric 12, but may not overlap with the second signal line 22, when viewed in the normal direction. In addition, a portion in contact with the third-B extension portion 223B of the third dielectric 13 is at least partially overlapped with a portion in contact with the second-B extension portion 222B of the second dielectric 12, but may not overlap with the second signal line 22, when viewed in the normal direction.

As such, the second dielectric 12 of the second-A extension portion 222A is located to be at least partially overlapped with the first dielectric 11 of the first-A extension portion 221A in the normal direction, and the third dielectric 13 of the third-A extension portion 223A is located to be at least partially overlapped with the second dielectric 12 of the second-A extension portion 222A in the normal direction. In addition, the second dielectric 12 of the second-B extension portion 222B is located to be at least partially overlapped with the first dielectric 11 of the first-B extension portion 221B in the normal direction and the third dielectric 13 of the third-B extension portion 223B is located to be at least partially overlapped with the second dielectric 12 of the second-B extension portion 222B in the normal direction, and thus, the widths of the overlapped portions are decreased.

As such, the space occupied by the dielectrics 11 to 13 when viewed in the normal direction is smaller than the embodiment if not, so that it is advantageous in the arrangement in the case where the space where the flexible circuit board 1 is disposed is small (for example, a case where the elements are disposed around the disposed space and the space where the flexible circuit board 1 is disposed is small).

Figure 7:
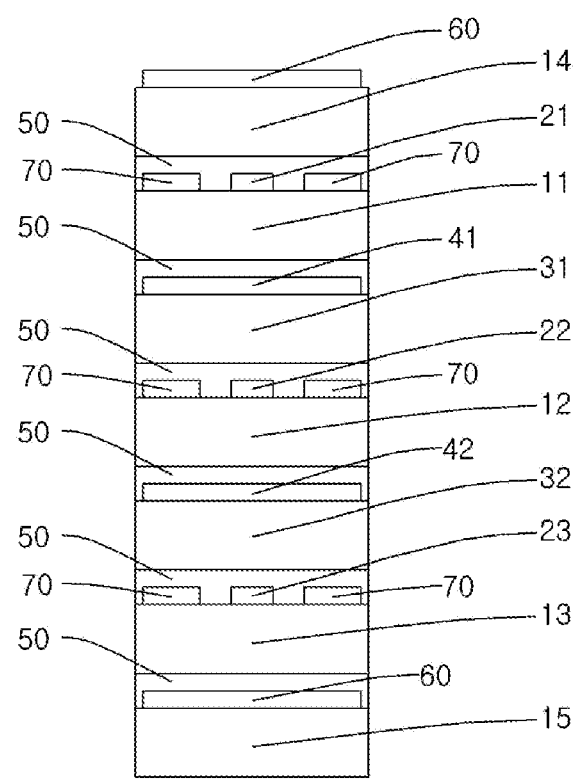
FIG. 7 is a diagram for describing a cross section of a first part of FIGS. 2 to 6.
Figure 12:
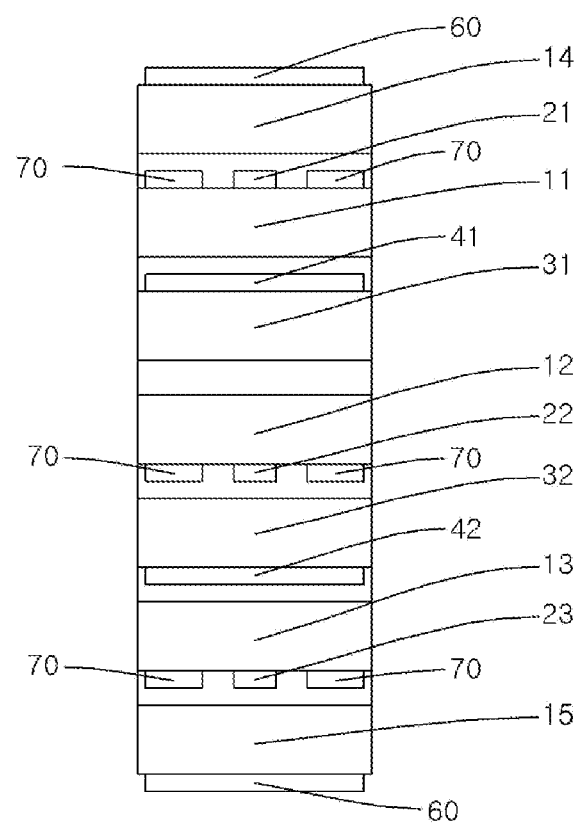
FIG. 12 is a diagram for describing a cross section of a first part of FIGS. 2 to 6.
Figure 14:
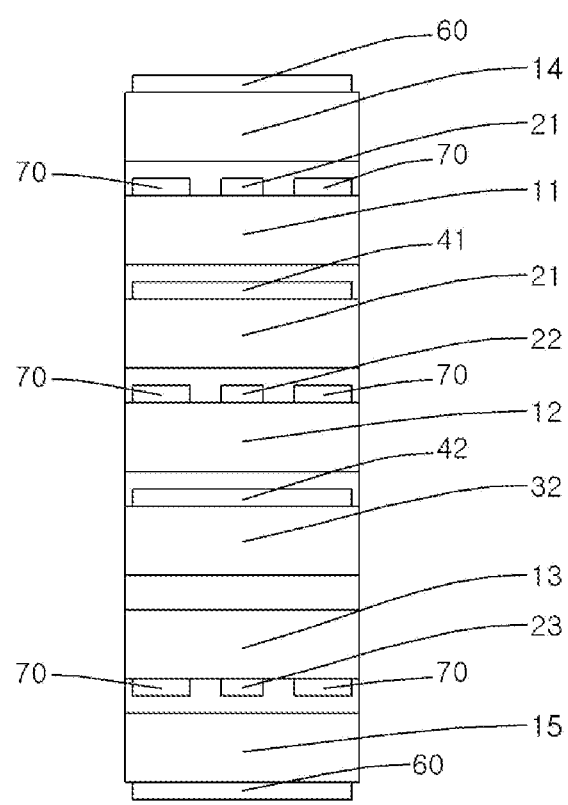
FIG. 14 is a diagram for describing a cross section of a first part of FIGS. 2 to 6.

FIGS. 7, 12, and 14 are diagrams describing cross sections of the first parts 100 of the signal lines 21 to 23 of FIGS. 2 to 6, respectively.

Further, FIGS. 7, 12, and 14 are diagrams describing cross sections showing various embodiments for surfaces which are in surface contact with the first signal line 21, the second signal line 22, and the third signal line 23.

Among them, FIG. 7 is a diagram describing a cross section showing an embodiment in which all of the first signal line 21, the second signal line 22, and the third signal line 23 are in contact with the upper surface.

Further, FIG. 12 is a diagram describing a cross section showing an embodiment in which the first signal line 21 is in contact with the upper surface, and the second signal line 22 and the third signal line 23 are in contact with the lower surface.

Further, FIG. 14 is a diagram describing a cross section showing an embodiment in which the first signal line 21 and the second signal line 22 are in contact with the upper surface, and the third signal line 23 is in contact with the lower surface.

FIGS. 8 to 10, and 13 are diagrams describing cross sections of the second parts 200 of the signal lines 21 to 23 of FIG. 2, respectively.

Figure 11:
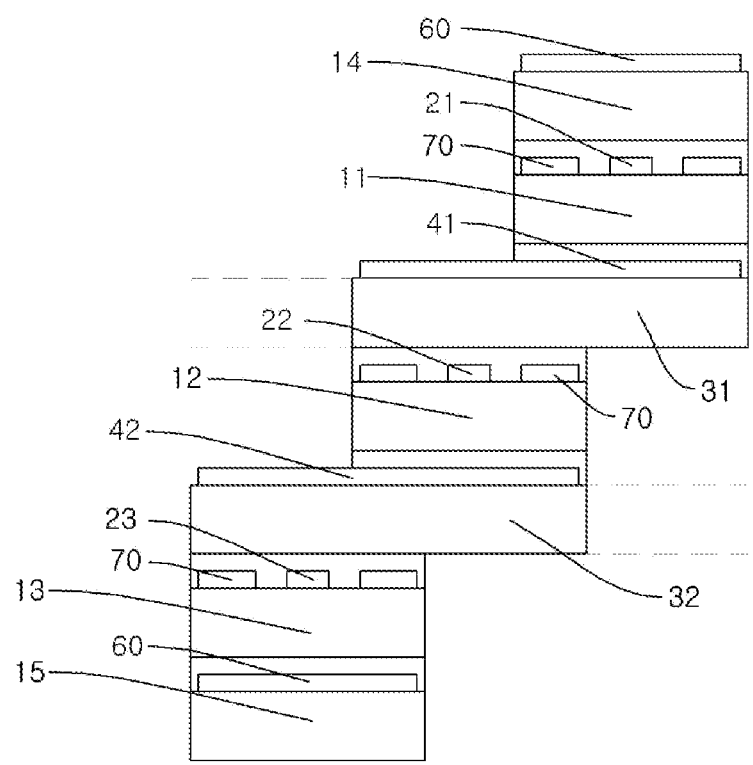
FIG. 11 is a diagram for describing a cross section of a second part of FIGS. 4 to 6.

FIG. 11 is a diagram describing cross sections of the second parts 200 of the signal lines 21 to 23 of FIGS. 4 to 6, respectively.

The flexible circuit board 1 according to the embodiment of the present invention may further include at least one of a first integrated dielectric 31 and a second integrated dielectric 32 as illustrated in FIGS. 7 to 14.

The first integrated dielectric 31 is located between a lower portion of the first dielectric 11 and an upper portion of the second dielectric 12. For example, the first integrated dielectric 31 may be placed on a fourth plane (the fourth plane itself is not illustrated on the drawing) between the first dielectric 11 and the second dielectric 12 while being parallel with the first plane 101.

The second integrated dielectric 32 is located between a lower portion of the second dielectric 12 and an upper portion of the third dielectric 13. For example, the second integrated dielectric 32 may be placed on a fifth plane (the fifth plane itself is not illustrated on the drawing) between the second dielectric 12 and the third dielectric 13 while being parallel with the first plane 101.

Here, each of the first integrated dielectric 31 and the second integrated dielectric 32 may be at least partially overlapped with each of the first dielectric 11, the second dielectric 12, and the third dielectric 13 when viewed in the normal direction.

A first example in which these integrated dielectrics 31 and 32 are overlapped with the dielectrics 11 to 13, respectively, will be described in more detail with reference to FIG. 8. The first integrated dielectric 31 may include a portion overlapped with the first dielectric 11 and a portion overlapped with the second dielectric 12, when viewed in a normal direction. Further, the first integrated dielectric 31 may be configured so as not to include a portion corresponding to a portion not overlapped with any one of the first dielectric 11 and the second dielectric 12 between the portion overlapped with the first dielectric 11 and the portion overlapped with the second dielectric 12, when viewed in the normal direction.

Further, the second integrated dielectric 32 may include a portion overlapped with the second dielectric 12 and a portion overlapped with the third dielectric 13, when viewed in a normal direction. Further, the second integrated dielectric 32 may be configured so as not to include a portion corresponding to a portion not overlapped with any one of the second dielectric 12 and the third dielectric 13 between the portion overlapped with the second dielectric 12 and the portion overlapped with the third dielectric 13, when viewed in the normal direction.

Unlike this, a second example in which these integrated dielectrics 31 and 32 are overlapped with the dielectrics 11 to 13, respectively, will be described in more detail with reference to FIG. 9. The first integrated dielectric 31 may include a portion overlapped with the first dielectric 11 and a portion overlapped with the second dielectric 12, when viewed in a normal direction. Further, the first integrated dielectric 31 may be configured so as to further include a portion corresponding to a portion not overlapped with any one of the first dielectric 11 and the second dielectric 12 between the portion overlapped with the first dielectric 11 and the portion overlapped with the second dielectric 12, when viewed in the normal direction.

Further, the second integrated dielectric 32 may include a portion overlapped with the second dielectric 12 and a portion overlapped with the third dielectric 13, when viewed in a normal direction. Further, the second integrated dielectric 32 may be configured so as to further include a portion corresponding to a portion not overlapped with any one of the second dielectric 12 and the third dielectric 13 between the portion overlapped with the second dielectric 12 and the portion overlapped with the third dielectric 13, when viewed in the normal direction. In each of the two examples (the first and second example) described above, an upper side of the first integrated dielectric 31 is located to be overlapped with the first dielectric 11 when viewed in the normal direction and the other lower side of the first integrated dielectric 31 may be located to be overlapped with the second dielectric 12 when viewed in the normal direction.

As such, when the first integrated dielectric 31 is located between the first dielectric 11 and the second dielectric 12 and the second integrated dielectric 32 is located between the second dielectric 12 and the third dielectric 13 so that the part of the flexible circuit board 1 is folded, the first dielectric 11 and the second dielectric 12 may be prevented by the first integrated dielectric 31 from being damaged due to direct friction therebetween and the second dielectric 12 and the third dielectric 13 may be prevented by the second integrated dielectric 32 from being damaged due to direct friction therebetween.

The flexible circuit board 1 according to the embodiment of the present invention may include the following features as illustrated in FIGS. 7 to 14.

The first integrated dielectric 31 may be directly thermally melt-bonded to the first dielectric 11 and the second dielectric 12, or may be coupled with a medium of any one of a bonding sheet 50 and a prepreg 50.

The second integrated dielectric 32 may be directly thermally melt-bonded to the second dielectric 12 and the third dielectric 13, or may be coupled with a medium of any one of a bonding sheet 50 and a prepreg 50.

As such, while the second part 200 of each of the signal lines 21 to 23 is folded, when the first dielectric 11 and the second dielectric 12 are folded while being coupled with the first integrated dielectric 31 and the second dielectric 12 and the third dielectric 13 are folded while being coupled with the second integrated dielectric 32, these components are not folded separately. That is, these components may be folded together based on the first integrated dielectric 31 and the second integrated dielectric 32.

The flexible circuit board 1 according to the embodiment of the present invention may further include a first integrated ground 41 and a second integrated ground 42 as illustrated in FIGS. 7 to 14.

The first integrated ground 41 is in contact with the upper surface or lower surface of the first integrated dielectric 31.

The second integrated ground 42 is in contact with the upper surface or lower surface of the second integrated dielectric 32.

The first integrated ground 41 is located to be partially overlapped with the first dielectric 11 and the second dielectric 12 in the normal direction. That is, the first integrated ground 41 may be in contact with the portion overlapped with the first dielectric 11 of the first integrated dielectric 31 when viewed in the normal direction and may have a shape corresponding to the shape of the first integrated dielectric 31 when viewed in the normal direction.

The second integrated ground 42 is located to be partially overlapped with the second dielectric 12 and the third dielectric 13 in the normal direction. That is, the second integrated ground 42 may be in contact with the portion overlapped with the second dielectric 12 of the second integrated dielectric 32 when viewed in the normal direction and may have a shape corresponding to the shape of the second integrated dielectric 32 when viewed in the normal direction.

Here, the integrated grounds 41 and 42 may be configured as various embodiments as follows.

For example, when described in more detail with reference to FIG. 9, the first integrated ground 41 may include a portion overlapped with the first dielectric 11 and a portion overlapped with the second dielectric 12, when viewed in a normal direction. Further, the first integrated ground 41 may be configured to further include a portion corresponding to a portion not overlapped with any one of the first dielectric 11 and the second dielectric 12 between the portion overlapped with the first dielectric 11 and the portion overlapped with the second dielectric 12, when viewed in the normal direction.

Further, the second integrated ground 42 may include a portion overlapped with the second dielectric 12 and a portion overlapped with the third dielectric 13, when viewed in a normal direction. Further, the second integrated ground 42 may be configured to further include a portion corresponding to a portion not overlapped with any one of the second dielectric 12 and the third dielectric 13 between the portion overlapped with the second dielectric 12 and the portion overlapped with the third dielectric 13, when viewed in the normal direction.

Unlike this, when described in more detail with reference to FIG. 10, the first integrated ground 41 may include a portion overlapped with the first dielectric 11 and a portion overlapped with the second dielectric 12, when viewed in a normal direction. Further, the first integrated ground 41 may be configured so as not to include a portion corresponding to a portion not overlapped with any one of the first dielectric 11 and the second dielectric 12 between the portion overlapped with the first dielectric 11 and the portion overlapped with the second dielectric 12, when viewed in a normal direction.

Further, the second integrated ground 42 may include a portion overlapped with the second dielectric 12 and a portion overlapped with the third dielectric 13, when viewed in a normal direction. Further, the second integrated ground 42 may be configured so as not to include a portion corresponding to a portion not overlapped with any one of the first dielectric 11 and the second dielectric 12 between the portion overlapped with the first dielectric 11 and the portion overlapped with the second dielectric 12, when viewed in a normal direction.

The flexible circuit board 1 according to the embodiment of the present invention may further include a first shield portion 81 and a second shield portion 82 as illustrated in FIGS. 8 to 10 and 13.

Each of the first shield portion 81 and the second shield portion 82 may be implemented to include a conductive paste or EMI shield film.

Further, the first shield portion 81 and the second shield portion 82 may be applied as various embodiments.

Figure 8:
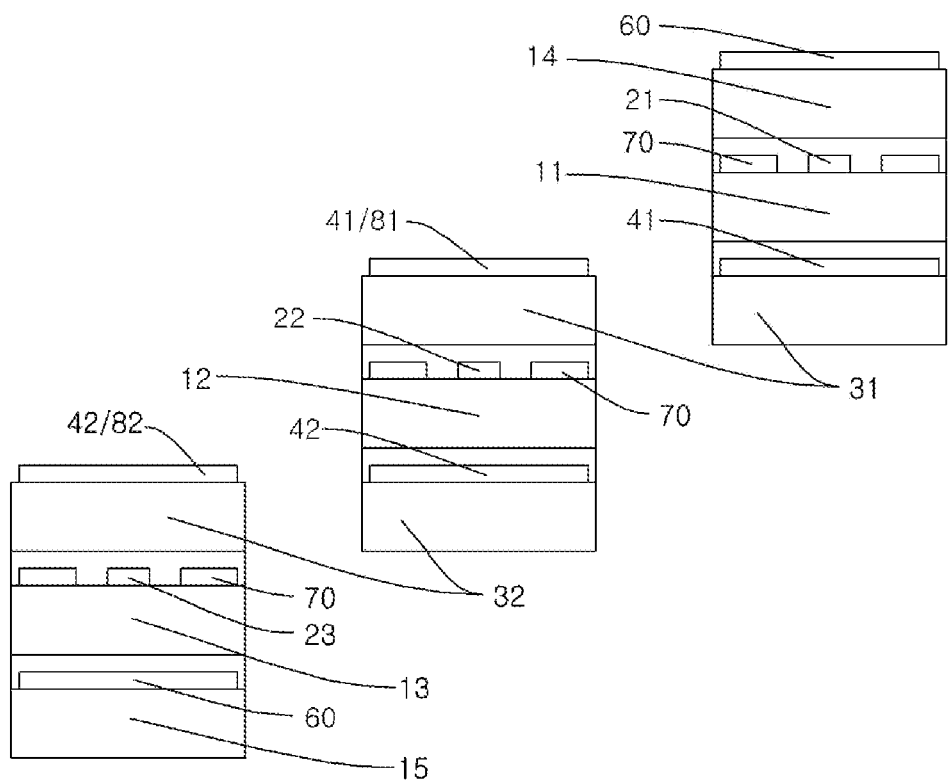
FIGS. 8 to 10 are diagrams for describing a cross section of a second part of FIG. 2.
Figure 10:
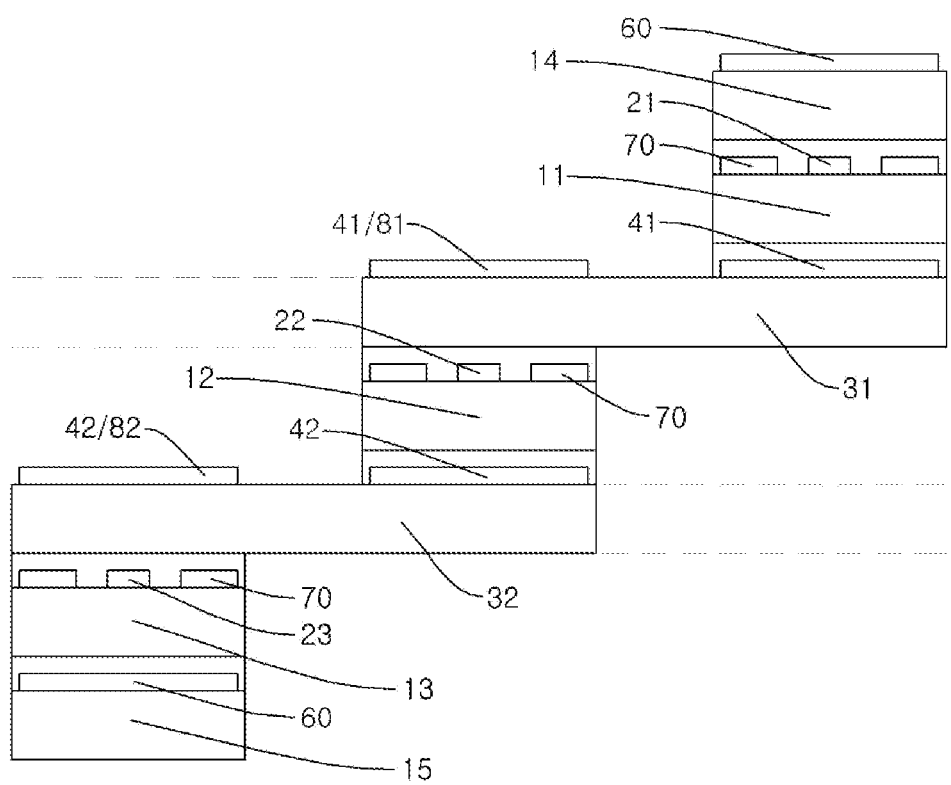

As an application embodiment of the first shield portion 81 and the second shield portion 82, as illustrated in FIGS. 8 and 10, the first shield portion 81 may replace the portion overlapped with the second dielectric 12 of the first integrated ground 41 in the normal direction and the second shield portion 82 may replace the portion overlapped with the third dielectric 13 of the second integrated ground 42 in the normal direction.

Figure 13:
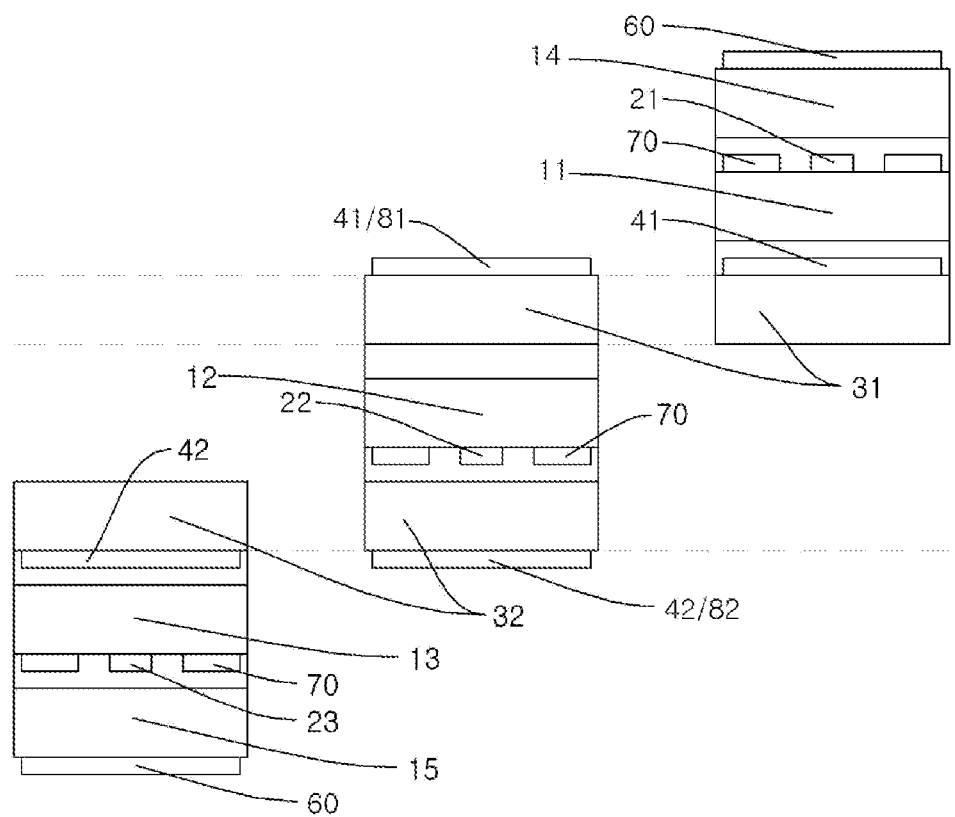
FIG. 13 is a diagram for describing a cross section of a second part of FIGS. 2 and 3.

Unlike this, as illustrated in FIG. 13, the first shield portion 81 may replace the portion overlapped with the second dielectric 12 of the first integrated ground 41 in the normal direction and the second shield portion 82 may replace the portion overlapped with the second dielectric 12 of the second integrated ground 42 in the normal direction.

Figure 9:
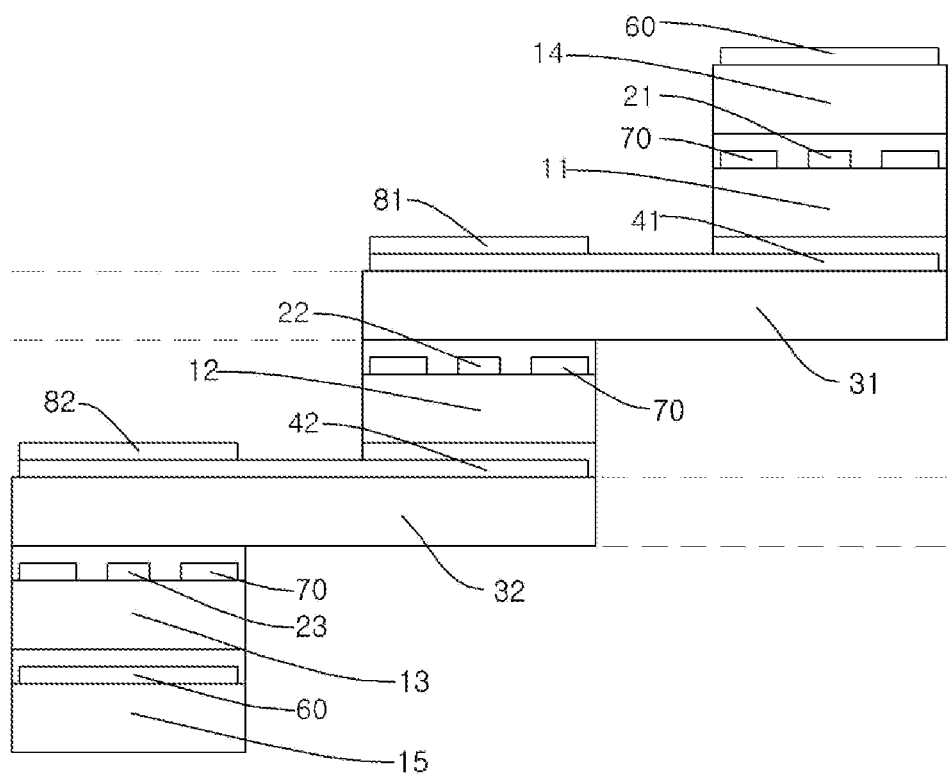

Alternatively, as another application embodiment of the first shield portion 81 and the second shield portion 82, as illustrated in FIG. 9, the first shield portion 81 may be in contact with the portion overlapped with the second dielectric 12 of the first integrated ground 41 in the normal direction and the second shield portion 82 may be in contact with the portion overlapped with the third dielectric 13 of the second integrated ground 42 in the normal direction.

The flexible circuit board 1 according to the embodiment of the present invention may further include a fourth dielectric 14, a fifth dielectric 15, an outer ground 60, and a side ground 70, as illustrated in FIGS. 7 to 14.

The fourth dielectric 14 is located on the first dielectric 11 and the outer ground 60 is in contact with the upper surface or lower surface.

At this time, the fourth dielectric 14 may be directly thermally melt-bonded to the first dielectric 11, or may be coupled with a medium of any one of a bonding sheet 50 and a prepreg 50.

The fifth dielectric 15 is located below the second dielectric 12 and the outer ground 60 is in contact with the upper surface or lower surface.

At this time, the fifth dielectric 15 may be directly thermally melt-bonded to the second dielectric 12, or may be coupled with a medium of any one of a bonding sheet 50 and a prepreg 50.

That is, the first dielectric 11, the second dielectric 12, and the third dielectric 13 are located between the fourth dielectric 14 and the fifth dielectric 15 in the normal direction.

The side ground 70 may be in contact with the same surface as a surface on which the first signal line 21 is in contact with the first dielectric 11, and may be spaced apart from both sides based on the first signal line 21.

Further, the side ground 70 may be in contact with the same surface as a surface on which the second signal line 22 is in contact with the second dielectric 12, and may be spaced apart from both sides based on the second signal line 22.

Further, the side ground 70 may be in contact with the same surface as a surface on which the third signal line 23 is in contact with the third dielectric 13, and may be spaced apart from both sides based on the third signal line 23.

At this time, as illustrated in FIG. 11, when the first dielectric 11 and the second dielectric 12 are overlapped with each other in the normal direction, one side of the side ground 70 in contact with the first dielectric 11 may be overlapped with one side of the side ground 70 in contact with the second dielectric 12 in the normal direction.

Further, when the second dielectric 12 and the third dielectric 13 are overlapped with each other in the normal direction, one side of the side ground 70 in contact with the second dielectric 12 may be overlapped with one side of the side ground 70 in contact with the third dielectric 13 in the normal direction.

FIGS. 15 to 19 are diagrams for describing the lamination of FIG. 2.

The flexible circuit board 1 according to the embodiment of the present invention may be laminated in the following order as illustrated in FIGS. 15 to 19.

Figure 15:
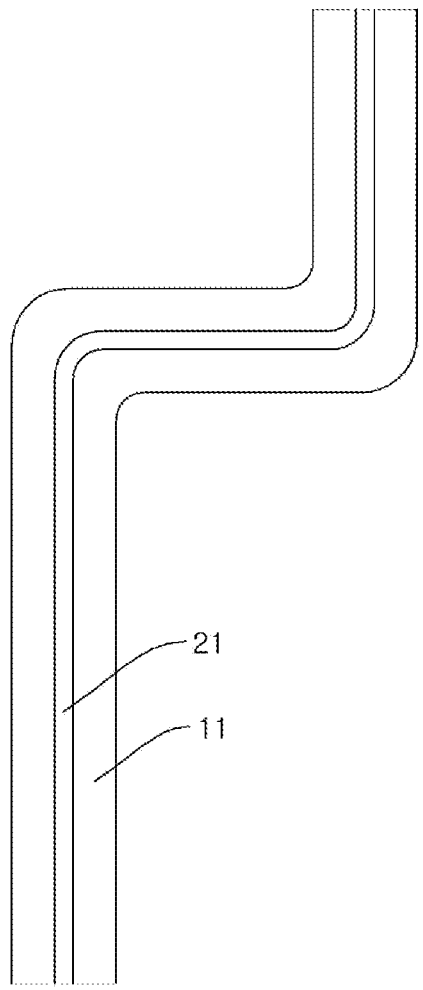
FIGS. 15 to 19 are diagrams for describing the lamination of FIG. 2.

First, as illustrated in FIG. 15, the first dielectric 11 in which the first signal line 21 is in contact with the upper surface or lower surface is laminated.

Figure 16:
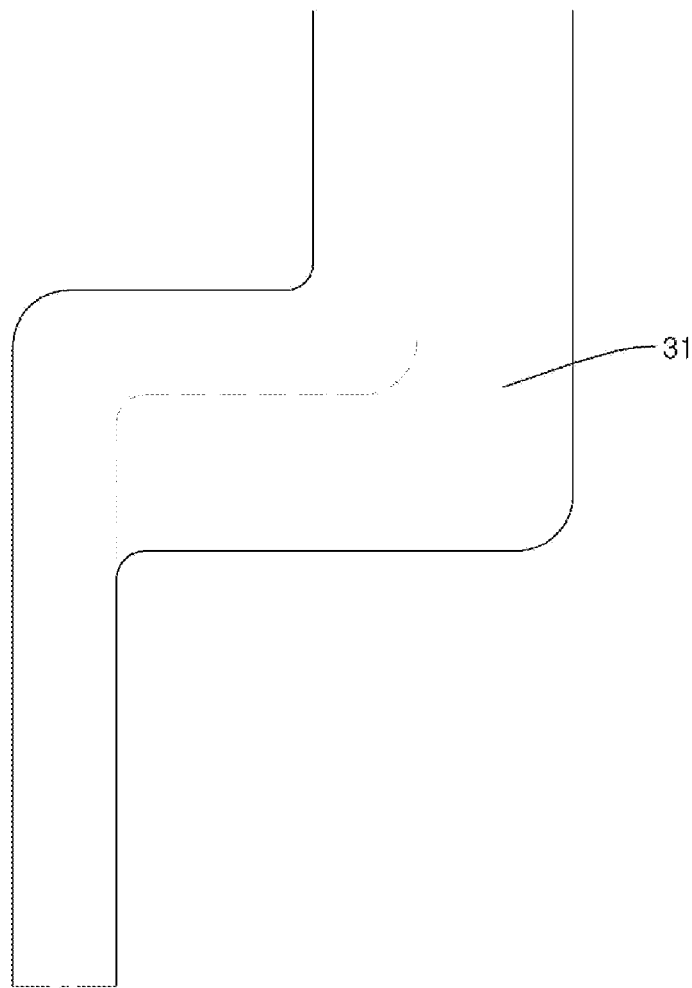

Next, as illustrated in FIG. 16, the first integrated dielectric 31 is laminated. At this time, the first dielectric 11 may be disposed to be biased on the left or right side of the lower portion of the first integrated dielectric 31.

Figure 17:
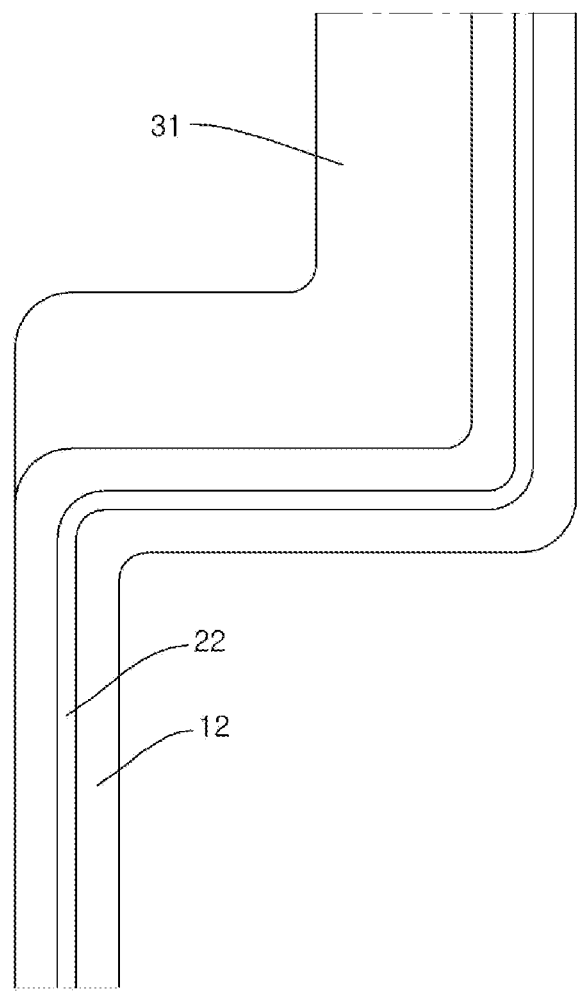

Next, as illustrated in FIG. 17, the second dielectric 12 in which the second signal line 22 is in contact with the upper surface or lower surface is laminated. At this time, the second dielectric 12 may be disposed to be biased on the left or right side of the upper portion of the first integrated dielectric 31.

Figure 18:
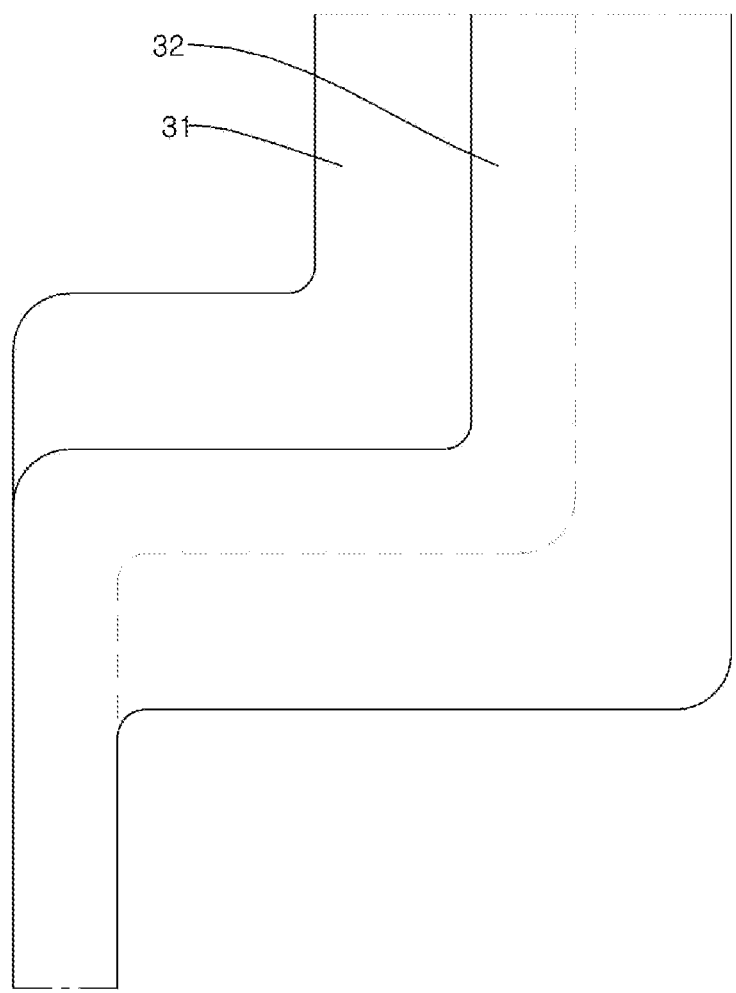

Next, as illustrated in FIG. 18, the second integrated dielectric 32 is laminated. At this time, the second dielectric 12 may be disposed to be biased on the left or right side of the lower portion of the second integrated dielectric 32.

Figure 19:
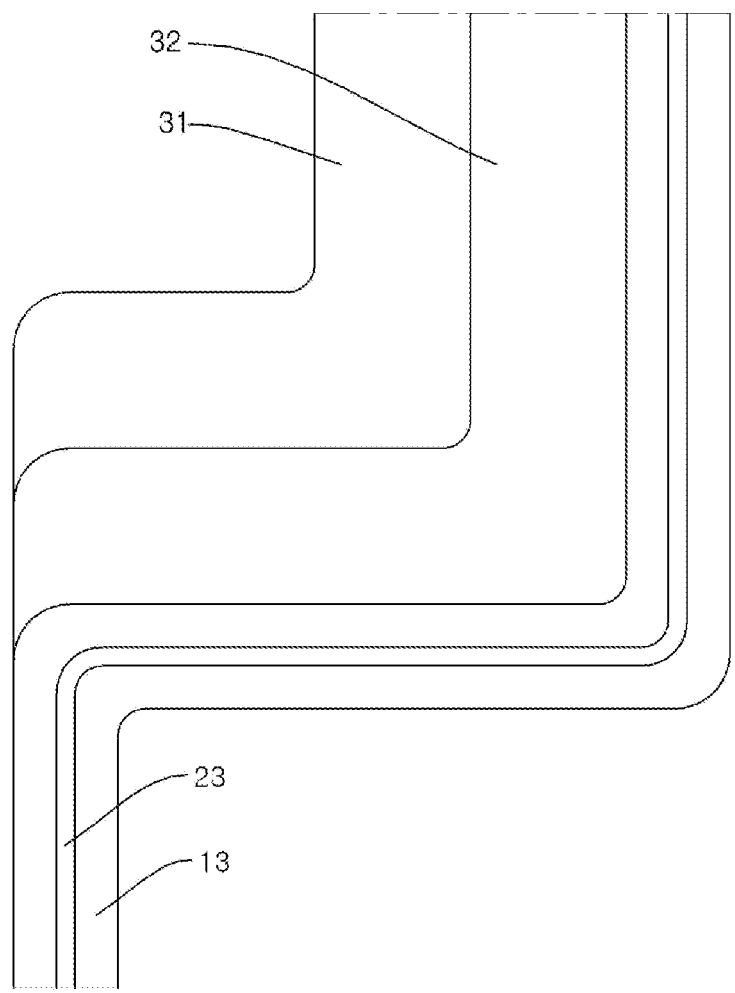

Next, as illustrated in FIG. 19, the third dielectric 13 in which the third signal line 23 is in contact with the upper surface or lower surface is laminated. At this time, the third dielectric 13 may be disposed to be biased on the left or right side of the upper portion of the second integrated dielectric 32.

The lamination described above has been described with reference to FIG. 2, but in other drawings, may also be laminated in such a method.

Figure 20:
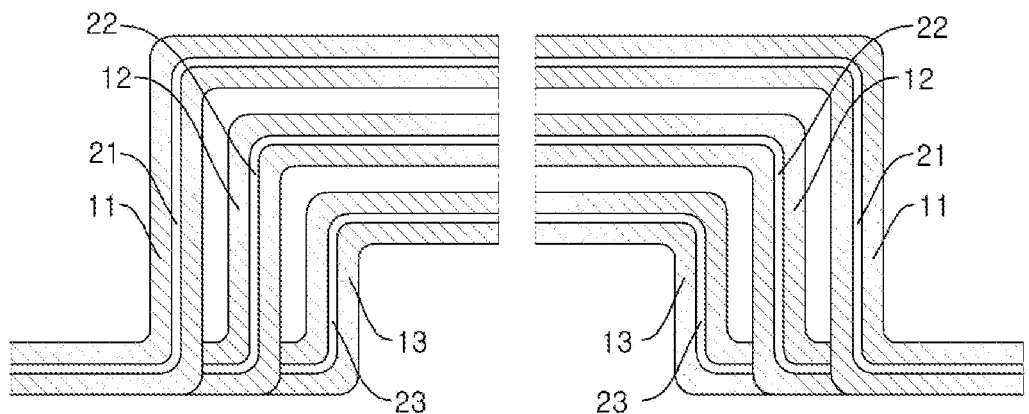
FIGS. 20 to 22 are diagrams for describing a shape in which a flexible circuit board is disposed in a wireless terminal.
Figure 21:
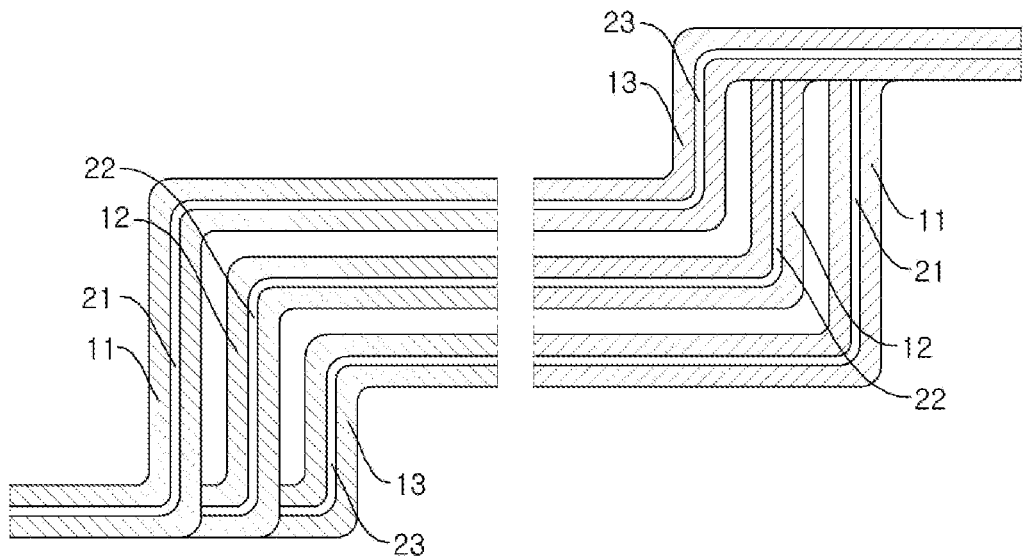
Figure 22:
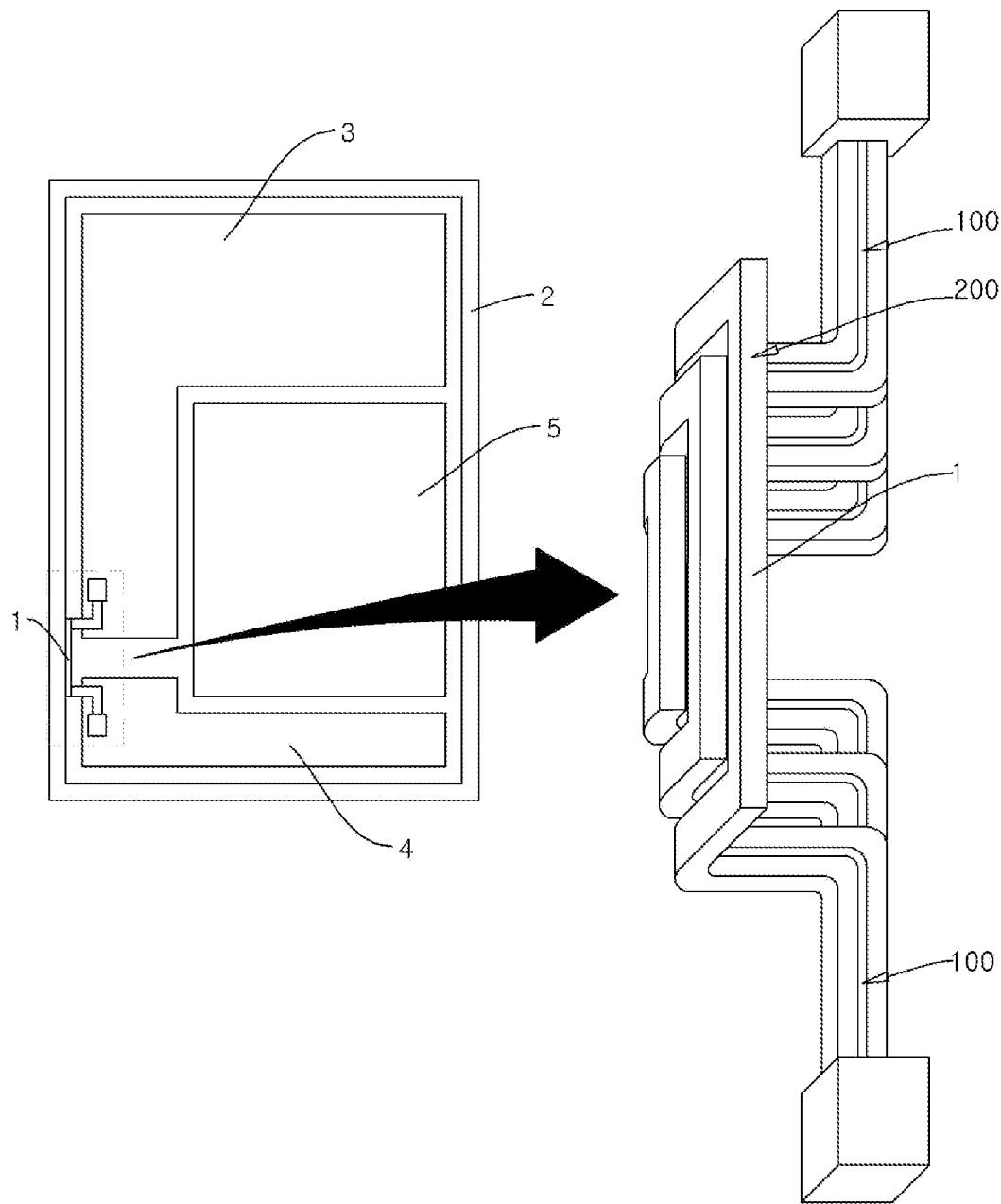

FIGS. 20 to 22 are diagrams for describing shapes in which the flexible circuit board 1 is disposed in the wireless terminal.

The flexible circuit board 1 according to the embodiment of the present invention may include the following features as illustrated in FIGS. 20 and 21.

The flexible circuit board 1 may include two first parts 100 and two second parts 200 of the first signal line 21, two first parts 100 and two second parts 200 of the second signal line 22, and two first parts 100 and two second parts 200 of the third signal line 23. Further, the dielectrics 11 to 13 may be disposed to be in contact with each other along the first parts 100 and the second parts 200, respectively.

At this time, the two second parts 200 of the first signal line 21 are symmetrically connected to each other, and each of the two first parts 100 of the first signal line 21 may be connected to one end of the second part 200 of the first signal line 21. In addition, the two second parts 200 of the second signal line 22 are symmetrically connected to each other, and each of the two first parts 100 of the second signal line 22 may be connected to one end of the second part 200 of the second signal line 22. This is also the same for the third signal line 23 and the third dielectric 13.

At this time, the second parts 200 of each of the signal lines 21 to 23 may have a symmetrical shape, for example, a line symmetrical shape as illustrated in FIG. 20 or a point symmetrical shape as illustrated in FIG. 21.

The flexible circuit board 1 according to the embodiment of the present invention may be disposed in the wireless terminal as illustrated in FIG. 22, and includes the following features.

The respective signal lines 21 to 23 and the dielectrics 11 to 13 in contact with the signal lines 21 to 23 may be disposed to be in contact with a surface of the wireless terminal, which is provided to be vertical to the first plane 101. To this end, parts of the second parts 200 of the respective signal lines 21 to 23, and parts of the respective dielectrics 11 to 13 may include portions in contact with the first plane 101 in a vertical direction.

Those described above through FIGS. 7 to 22 may be applied to Embodiment 1 of course, and may also be applied to Embodiments 2 and 3 to be described below.

FIGS. 23 and 24 are diagrams according to Embodiment 2.

Next, Embodiment 2 will be described.

A flexible circuit board 1 according to the embodiment of the present invention may include a first dielectric 11, a second dielectric 12, a third dielectric 13, a first signal line 21, a second signal line 22, and a third signal line 23, as illustrated in FIGS. 23 and 24.

According to the embodiment of the present invention, the first signal line 21 of the flexible circuit board 1 is a second part 200, and may include a first-A bending portion 211A which is connected with a first part 100 of the first signal line 21 and formed to be bent on a first plane 101, and a first-A extension portion 221A extending on the first plane 101 from a direction in which the first-A bending portion 211A is bent and directed.

The second signal line 22 of the flexible circuit board 1 is a second part 200, and may include a second-A bending portion 212A which is connected with a first part 100 of the second signal line 22 and formed to be bent on a second plane 102, and a second-A extension portion 222A extending on the second plane 102 from a direction in which the second-A bending portion 212A is bent and directed.

Further, the third signal line 23 of the flexible circuit board 1 is a second part 200, and may include a third-A bending portion 213A which is connected with a first part 100 of the third signal line 23 and formed to be bent on a third plane 103, and a third-A extension portion 223A extending on the third plane 103 from a direction in which the third-A bending portion 213A is bent and directed.

At this time, an angle at which each of the first-A bending portion 211A, the second-A bending portion 212A, and the third-A bending portion 213A is bent on each plane may be within 30° to 120°, and for example, 90°, but is not limited thereto. This is the same even for the first-B bending portion 211B, the second-B bending portion 212B, and the third-B bending portion 213B.

In addition, the first-A extension portion 221A, the second-A extension portion 222A and the third-A extension portion 223A may be disposed to be folded or in contact with a housing 2.

The flexible circuit board 1 according to the embodiment of the present invention may be disposed so that the first dielectric 11, the second dielectric 12, and the third dielectric 13 are partially overlapped with each other when viewed in a normal direction, and as a result, a space occupied by the dielectrics 11 to 13 when viewed in the normal direction may be smaller than that of the embodiment if not.

As an example in which the dielectrics 11 to 13 are partially overlapped with each other, as illustrated in FIG. 24, that is, a portion in contact with the second-A extension portion 222A of the second dielectric 12 is at least partially overlapped with a portion in contact with the first-A extension portion 221A of the first dielectric 11, but may not overlap with the first signal line 21, when viewed in the normal direction. Further, a portion in contact with the third-A extension portion 223A of the third dielectric 13 is at least partially overlapped with a portion in contact with the second-A extension portion 222A of the first dielectric 11, but may not overlap with the second signal line 22, when viewed in the normal direction.

As such, when the second dielectric 12 of the second-A extension portion 222A is at least partially overlapped with the first dielectric 11 of the first-A extension portion 221A in the normal direction and the third dielectric 13 of the third-A extension portion 223A is at least partially overlapped with the second dielectric 12 of the second-A extension portion 222A in the normal direction, the widths of the overlapped portions are decreased.

As such, the space occupied by each of the dielectrics 11 to 13 when viewed in the normal direction is smaller than the embodiment if not, so that it is advantageous in the arrangement in the case where the space where the flexible circuit board 1 is disposed is small (for example, a case where the elements are disposed around the disposed space and the space where the flexible circuit board 1 is disposed is small).

FIGS. 25 to 26 are diagrams according to Embodiment 3.

Next, Embodiment 3 will be described.

A flexible circuit board 1 according to the embodiment of the present invention may include a first dielectric 11, a second dielectric 12, a third dielectric 13, a first signal line 21, a second signal line 22, and a third signal line 23, as illustrated in FIGS. 25 and 26.

According to the embodiment of the present invention, the first signal line 21 of the flexible circuit board 1 is a second part 200, and may include a first-A bending portion 211A which is connected with the first part 100 of the first signal line 21 and formed to be bent on the first plane 101, a first-A extension portion 221A extending on the first plane 101 from a direction in which the first-A bending portion 211A is bent and directed, a first-B bending portion 211B which is formed to be bent on the first plane 101 from the extended first-A extension portion 221A, and a first-B extension portion 221B extending on the first plane 101 from a direction in which the first-B bending portion 211B is bent and directed.

Further, the second signal line 22 of the flexible circuit board 1 is a second part 200 and may include a second-B extension portion 222B which is connected with the first part 100 of the second signal line 22 and extended on the second plane 102.

Further, the third signal line 23 of the flexible circuit board 1 is a second part 200, and may include a third-A bending portion 213A which is connected with the first part 100 of the third signal line 23 and formed to be bent on the third plane 103, a third-A extension portion 223A extending on the third plane 103 from a direction in which the third-A bending portion 213A is bent and directed, a third-B bending portion 213B which is formed to be bent on the third plane 103 from the extended third-A extension portion 223A, and a third-B extension portion 223B extending on the third plane 103 from a direction in which the third-B bending portion 213B is bent and directed.

At this time, an angle at which each of the first-A bending portion 211A and the third-A bending portion 213A is bent may be within 30° to 120°, and for example, 90°, but is not limited thereto. This may be applied in the same manner even in the first-B bending portion 211B and the third-B bending portion 213B.

In addition, the first-B extension portion 221B, the second-B extension portion 222B and the third-B extension portion 223B may be disposed to be folded or in contact with the housing 2.

Further, the first-B bending portion 211B may be directly extended from the first-A bending portion 211A except for the first-A extension portion 221A and the third-B bending portion 213B may be directly extended from the third-A bending portion 213A except for the third-A extension portion 223A.

The flexible circuit board 1 according to the embodiment of the present invention may include the following features as illustrated in FIG. 25.

The second part 200 of the third signal line 23 may be symmetrical with the second part 200 of the first signal line 21 based on the second part 200 of the second signal line 22, and may be symmetrical even with the bent portion.

Since only the third dielectric 13 portion is different from that of FIG. 25 described above and other configurations are formed in the same manner, the flexible circuit board 1 according to the embodiment of the present invention may have a different shape as illustrated in FIG. 26. Therefore, portions not illustrated will be used for those in FIG. 25.

As the embodiment having a different shape from FIG. 25, the third dielectric 13 is located on the first dielectric 11, has the third signal line 23 in contact with the upper or lower surface thereof and a width extending based on the third signal line 23, and may extend in an extension direction of the third signal line 23.

At this time, the length of the third-A extension portion 223A is larger than the length of the first-A extension portion 221A and a distance between a vertical plane 104 including the first part 100 of the third signal line 23 and the third-B extension portion 223B may be farther than a distance between the vertical plane 104 and the first-B extension portion 221B.

That is, in FIG. 25, the first signal line 21 and the third signal line 23 have a shape to be symmetrical based on the second signal line 22 and in FIG. 26, the first signal line 21 and the third signal line 23 have a shape to be biased to one side based on the second signal line 22.

Figure 27:
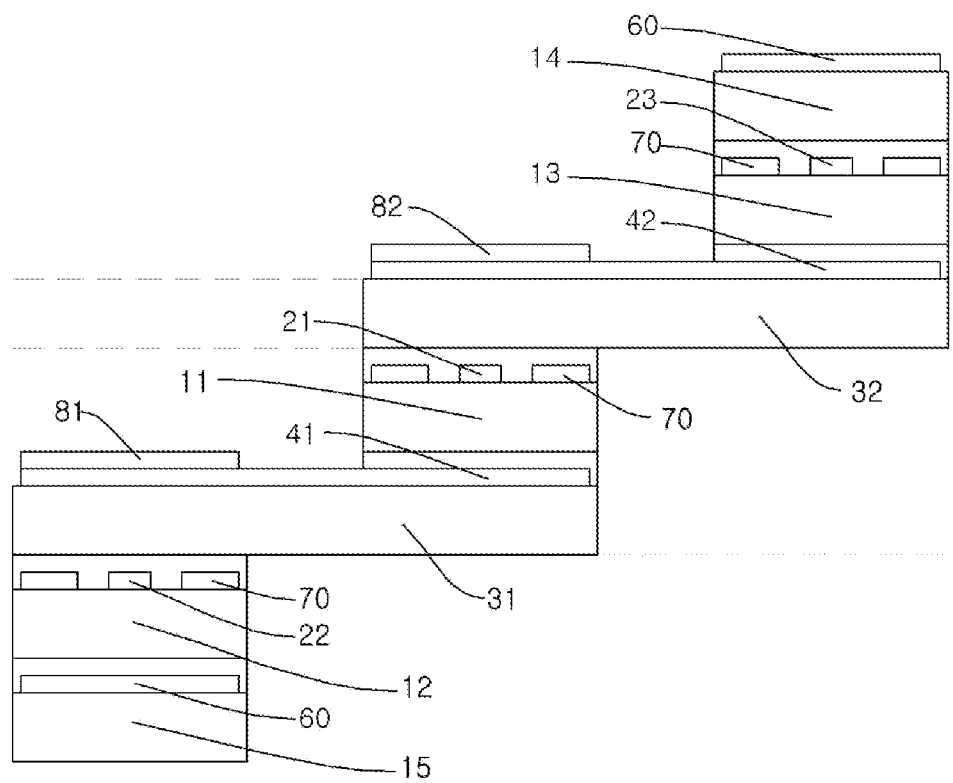
FIG. 27 is a diagram for describing a cross section of a second part of FIG. 26.

FIG. 27 is a diagram for described a partial cross section of the flexible circuit board 1 illustrated in FIG. 26.

The flexible circuit board 1 according to the embodiment of the present invention may further include at least one of a first integrated dielectric 31 and a second integrated dielectric 32 as illustrated in FIG. 27.

The first integrated dielectric 31 is located between a lower portion of the first dielectric 11 and an upper portion of the second dielectric 12.

The second integrated dielectric 32 is located between an upper portion of the first dielectric 11 and a lower portion of the third dielectric 13.

FIGS. 28 to 31 are diagrams for describing shapes in which the flexible circuit board 1 is disposed in the wireless terminal.

The flexible circuit board 1 according to the embodiment of the present invention may be disposed on the wireless terminal. At this time, at least some of the second part 200 of the first signal line 21, the second part 200 of the second signal line 22, and the second part 200 of the third signal line 23 may be disposed on or below a battery 5 as illustrated in FIGS. 28 to 31, respectively.

Figure 28:
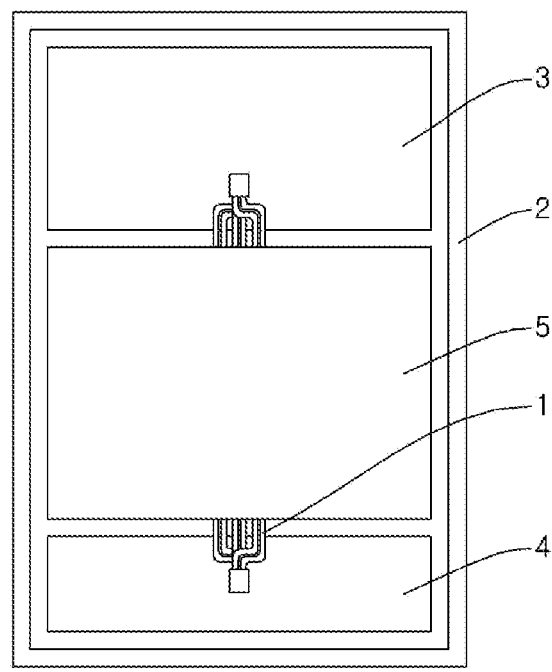
FIGS. 28 to 31 are diagrams for describing shapes disposed in the wireless terminal.
Figure 29:
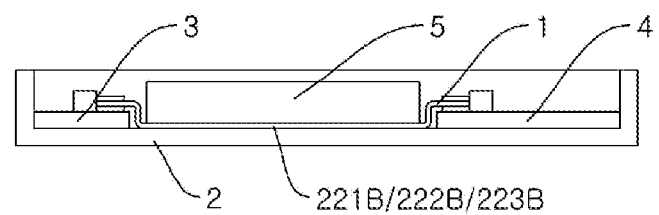

More specifically, as illustrated in FIGS. 28 and 29, the first-B extension portion 221B, the second-B extension portion 222B, and the third-B extension portion 223B may be disposed in the wireless terminal so as to pass below the battery 5.

At this time, FIG. 28 is a diagram of the arrangement of the first-B extension portion 221B, the second-B extension portion 222B, and the third-B extension portion 223B when viewed from the front surface, and, further, FIG. 29 is a diagram of a cross section of the arrangement of the first-B extension portion 221B, the second-B extension portion 222B, and the third-B extension portion 223B when viewed from the side surface.

Figure 30:
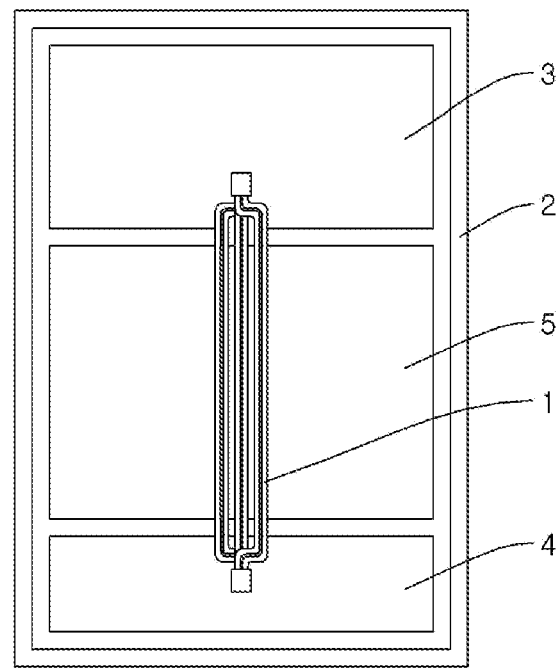
Figure 31:
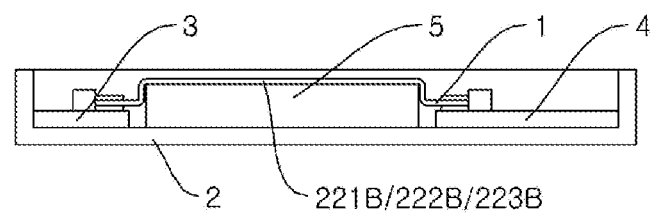

Unlike this, as illustrated in FIGS. 30 and 31, the first-B extension portion 221B, the second-B extension portion 222B, and the third-B extension portion 223B may be disposed in the wireless terminal so as to pass above the battery 5. At this time, FIG. 30 is a diagram of the arrangement of the first-B extension portion 221B, the second-B extension portion 222B, and the third-B extension portion 223B when viewed from the front surface, and FIG. 31 is a diagram of a cross section of the arrangement of the first-B extension portion 221B, the second-B extension portion 222B, and the third-B extension portion 223B when viewed from the side surface.

As described above, according to an embodiment, when the flexible circuit board includes the plurality of signal lines and the plurality of dielectrics, the first parts 100 which are parts of these signal lines and the dielectrics in contact with the first parts 100 overlap with each other when viewed in a predetermined direction. Accordingly, it is possible to minimize a space where the signal lines and the dielectrics described above are occupied in the flexible circuit board when viewed in a predetermined direction.

Further, the second parts 200 which are the remaining parts of these signal lines and the dielectrics in contact with the second parts 200 do not overlap with each other when viewed in a predetermined direction, that is, the second parts 200 and the dielectrics in contact with the second parts are disposed to be spaced apart from each other when viewed in a predetermined direction. Accordingly, the radius of curvature to these second parts 200 and the dielectrics in contact with these second parts 200 may be reduced, and as a result, a part of the flexible circuit board may be easily folded.

We claim:
1. A flexible circuit board, comprising:
a first signal line extending on a first plane;
a first dielectric extending in an extension direction of the first signal line while being in contact with the first signal line;
a second signal line extending on a second plane parallel with the first plane;
a second dielectric extending in an extension direction of the second signal line while being in contact with the second signal line;
a third signal line extending on a third plane parallel with the second plane; and
a third dielectric extending in an extension direction of the third signal line while being in contact with the third signal line,
wherein the first signal line includes a first part overlapped with the second signal line and a second part not overlapped with the second signal line when viewed in a normal direction of the first plane,
wherein the second signal line includes a first part overlapped with the first signal line and a second part not overlapped with the first signal line when viewed in the normal direction,
wherein the third signal line includes a first part which overlaps with both the first signal line and the second signal line and a second part which does not overlap with any one of the first signal line and the second signal line, when viewed in the normal direction,
wherein the second part of the first signal line includes:
a first-A bending portion which is connected with the first part of the first signal line and formed to be bent on the first plane,
a first-A extension portion extending on the first plane from a direction in which the first-A bending portion is bent and directed,
a first-B bending portion which is formed to be bent on the first plane from the extended first-A extension portion, and
a first-B extension portion extending on the first plane from a direction in which the first-B bending portion is bent and directed,
wherein the second part of the second signal line includes:
a second-A bending portion which is connected with the first part of the second signal line and formed to be bent on the second plane,
a second-A extension portion extending on the second plane from a direction in which the second-A bending portion is bent and directed,
a second-B bending portion which is formed to be bent on the second plane from the extended second-A extension portion, and
a second-B extension portion extending on the second plane from a direction in which the second-B bending portion is bent and directed,
wherein the second part of the third signal line includes:
a third-A bending portion which is connected with the first part of the third signal line and formed to be bent on the third plane,
a third-A extension portion extending on the third plane from a direction in which the third-A bending portion is bent and directed,
a third-B bending portion which is formed to be bent on the third plane from the extended third-A extension portion, and
a third-B extension portion extending on the third plane from a direction in which the third-B bending portion is bent and directed, and
wherein the relative lengths between the first-A extension portion, the second-A extension portion, the third-A extension portion are different from each other.

2. The flexible circuit board of claim 1, further comprising:
a first integrated dielectric which is placed on a fourth plane between the first dielectric and the second dielectric while being parallel with the first plane and overlapped with the first dielectric and the second dielectric when viewed in the normal direction.

3. The flexible circuit board of claim 2, wherein the first integrated dielectric further includes a portion corresponding to a portion not overlapped with any one of the first dielectric and the second dielectric between a portion overlapped with the first dielectric and a portion overlapped with the second dielectric, when viewed in the normal direction.

4. The flexible circuit board of claim 2, wherein the first integrated dielectric does not include a portion corresponding to a portion not overlapped with any one of the first dielectric and the second dielectric between a portion overlapped with the first dielectric and a portion overlapped with the second dielectric, when viewed in the normal direction.

5. The flexible circuit board of claim 2, further comprising:
a second integrated dielectric which is placed on a fifth plane between the second dielectric and the third dielectric while being parallel with the first plane and overlapped with the second dielectric and the third dielectric when viewed in the normal direction.

6. The flexible circuit board of claim 1, wherein a portion in contact with the second-A extension portion of the second dielectric is at least partially overlapped with a portion in contact with the first-A extension portion of the first dielectric, but is not overlapped with the first signal line, when viewed in the normal direction.

7. The flexible circuit board of claim 1, wherein a portion in contact with the third-A extension portion of the third dielectric is at least partially overlapped with a portion in contact with the second-A extension portion of the second dielectric, but is not overlapped with the second signal line, when viewed in the normal direction.

8. The flexible circuit board of claim 1, wherein the second part of the first signal line and the second part of the third signal line are symmetrical with each other based on the second part of the second signal line when viewed in the normal direction.

9. The flexible circuit board of claim 1, wherein a length of the third-A extension portion is larger than a length of the first-A extension portion, and
a distance between a vertical plane including the first part of the third signal line and the third-B extension portion is farther than a distance between the vertical plane and the first-B extension portion.

10. The flexible circuit board of claim 1, wherein the flexible circuit board includes the two first parts of the first signal line and the two second parts of the first signal line, and the two first parts of the second signal line and the two second parts of the second signal line,
wherein the two second parts of the first signal line are symmetrically connected to each other, and each of the two first parts of the first signal line is connected to one end of the second part of the first signal line, and
the two second parts of the second signal line are symmetrically connected to each other, and each of the two first parts of the second signal line is connected to one end of the second part of the second signal line.

11. A wireless terminal, comprising:
a first signal line extending on a first plane;
a first dielectric extending in an extension direction of the first signal line while being in contact with the first signal line;
a second signal line extending on a second plane parallel with the first plane;
a second dielectric extending in an extension direction of the second signal line while being in contact with the second signal line;
a third signal line extending on a third plane parallel with the second plane; and
a third dielectric extending in an extension direction of the third signal line while being in contact with the third signal line,
wherein the first signal line includes a first part overlapped with the second signal line and a second part not overlapped with the second signal line when viewed in a normal direction of the first plane,
wherein the second signal line includes a first part overlapped with the first signal line and a second part not overlapped with the first signal line when viewed in the normal direction,
wherein each of at least a part of the second part of the first signal line and at least a part of the second part of the second signal line is disposed to be in contact with a surface in the wireless terminal, which is provided to be vertical to the first plane,
wherein the third signal line includes a first part which overlaps with both the first signal line and the second signal line and a second part which does not overlap with any one of the first signal line and the second signal line, when viewed in the normal direction,
wherein the second part of the first signal line includes:
a first-A bending portion which is connected with the first part of the first signal line and formed to be bent on the first plane,
a first-A extension portion extending on the first plane from a direction in which the first-A bending portion is bent and directed,
a first-B bending portion which is formed to be bent on the first plane from the extended first-A extension portion, and
a first-B extension portion extending on the first plane from a direction in which the first-B bending portion is bent and directed,
wherein the second part of the second signal line includes:
a second-A bending portion which is connected with the first part of the second signal line and formed to be bent on the second plane,
a second-A extension portion extending on the second plane from a direction in which the second-A bending portion is bent and directed,
a second-B bending portion which is formed to be bent on the second plane from the extended second-A extension portion, and
a second-B extension portion extending on the second plane from a direction in which the second-B bending portion is bent and directed,
wherein the second part of the third signal line includes:
a third-A bending portion which is connected with the first part of the third signal line and formed to be bent on the third plane,
a third-A extension portion extending on the third plane from a direction in which the third-A bending portion is bent and directed,
a third-B bending portion which is formed to be bent on the third plane from the extended third-A extension portion, and
a third-B extension portion extending on the third plane from a direction in which the third-B bending portion is bent and directed, and
wherein the relative lengths between the first-A extension portion, the second-A extension portion, the third-A extension portion are different from each other.

12. A wireless terminal, comprising:
a battery;
a first signal line extending on a first plane;
a first dielectric extending in an extension direction of the first signal line while being in contact with the first signal line;
a second signal line extending on a second plane parallel with the first plane;
a second dielectric extending in an extension direction of the second signal line while being in contact with the second signal line;
a third signal line extending on a third plane parallel with the second plane; and
a third dielectric extending in an extension direction of the third signal line while being in contact with the third signal line,
wherein the first signal line includes a first part overlapped with the second signal line and a second part not overlapped with the second signal line when viewed in a normal direction of the first plane,
wherein the second signal line includes a first part overlapped with the first signal line and a second part not overlapped with the first signal line when viewed in the normal direction,
wherein the third signal line includes a first part which overlaps with both the first signal line and the second signal line and a second part which does not overlap with any one of the first signal line and the second signal line, when viewed in the normal direction, wherein at least a part of the second part of the first signal line and the second part of the second signal line is disposed above or below the battery, wherein the second part of the first signal line includes:
- a first-A bending portion which is connected with the first part of the first signal line and formed to be bent on the first plane,
- a first-A extension portion extending on the first plane from a direction in which the first-A bending portion is bent and directed,
- a first-B bending portion which is formed to be bent on the first plane from the extended first-A extension portion, and
- a first-B extension portion extending on the first plane from a direction in which the first-B bending portion is bent and directed, wherein the second part of the second signal line includes:
- a second-A bending portion which is connected with the first part of the second signal line and formed to be bent on the second plane,
- a second-A extension portion extending on the second plane from a direction in which the second-A bending portion is bent and directed,
- a second-B bending portion which is formed to be bent on the second plane from the extended second-A extension portion, and
- a second-B extension portion extending on the second plane from a direction in which the second-B bending portion is bent and directed, wherein the second part of the third signal line includes:
- a third-A bending portion which is connected with the first part of the third signal line and formed to be bent on the third plane,
- a third-A extension portion extending on the third plane from a direction in which the third-A bending portion is bent and directed,
- a third-B bending portion which is formed to be bent on the third plane from the extended third-A extension portion, and
- a third-B extension portion extending on the third plane from a direction in which the third-B bending portion is bent and directed, and wherein the relative lengths between the first-A extension portion, the second-A extension portion, the third-A extension portion are different from each other.

* * * * *